United States Patent
Miyatake

(10) Patent No.: US 8,339,868 B2
(45) Date of Patent: Dec. 25, 2012

(54) SEMICONDUCTOR DEVICE AND WRITE CONTROL METHOD FOR SEMICONDUCTOR DEVICE

(75) Inventor: Shinichi Miyatake, Chuo-ku (JP)

(73) Assignee: Elpida Memory, Inc., Tokyo (JP)

(*) Notice: Subject to any disclaimer, the term of this patent is extended or adjusted under 35 U.S.C. 154(b) by 292 days.

(21) Appl. No.: 12/726,703

(22) Filed: Mar. 18, 2010

(65) Prior Publication Data
US 2010/0238741 A1 Sep. 23, 2010

(30) Foreign Application Priority Data

Mar. 19, 2009 (JP) .................... 2009-067244
Apr. 6, 2009 (JP) .................... 2009-092156

(51) Int. Cl.
G11C 7/10 (2006.01)
G11C 7/06 (2006.01)
G11C 7/08 (2006.01)
G11C 29/04 (2006.01)

(52) U.S. Cl. ............... 365/189.05; 365/200; 365/225.7; 365/201; 365/205

(58) Field of Classification Search ............ 365/189.05, 365/200, 225.7, 201, 205
See application file for complete search history.

(56) References Cited

U.S. PATENT DOCUMENTS

| | | | |
|---|---|---|---|
| 6,367,030 B1 * | 4/2002 | Yamauchi | 714/6.32 |
| 7,075,835 B2 | 7/2006 | Fujima | |
| 2001/0003509 A1 * | 6/2001 | Hosono et al. | 365/185.05 |
| 2003/0095448 A1 * | 5/2003 | Ichige et al. | 365/200 |

FOREIGN PATENT DOCUMENTS

JP    2004-303354 A    10/2004

* cited by examiner

*Primary Examiner* — J. H. Hur
(74) *Attorney, Agent, or Firm* — Sughrue Mion, PLLC

(57) ABSTRACT

To include a memory cell array that stores therein data in a reversible manner, an antifuse circuit that stores therein data in a nonvolatile manner, a sense amplifier array that temporarily holds data that is read from the memory cell array of data to be written in the memory cell array, and a control circuit that performs a control for writing the data held in the sense amplifier array in the antifuse circuit. According to the present invention, it is not required to provide any dedicated latch circuit for each antifuse element. Therefore, a writing process of writing data in the antifuse circuit can be performed at high speed without causing an increase of the chip dimension due to a dedicated latch circuit.

21 Claims, 17 Drawing Sheets

SEMICONDUCTOR DEVICE AND WRITE CONTROL METHOD FOR SEMICONDUCTOR DEVICE

BACKGROUND OF THE INVENTION

1. Field of the Invention

The present invention relates to a semiconductor device and a technique of storing information in a nonvolatile memory unit that is provided in a semiconductor device for controlling the semiconductor device. For example, the present invention relates to a semiconductor device including both a memory cell that stores therein data in a reversible manner and a memory cell that stores therein data in an irreversible manner, such as a semiconductor memory including a defective address memory circuit. Furthermore, the present invention relates to a writing method for storing information in a nonvolatile memory unit that is provided for controlling an internal operation of the semiconductor device.

2. Description of Related Art

In a semiconductor device such as a DRAM (Dynamic Random Access Memory), a defective address is saved by replacing a defective cell that does not perform a normal operation with a redundant cell. Generally, a fuse element is used for storing the defective address. The fuse element in an initial state is in an electrically conductive state. By blowing the fuse element with an application of a laser beam, it is possible to store the defective address in the fuse element in a nonvolatile manner. Therefore, arranging a plurality of such fuse elements and blowing desired ones from among the fuse elements makes it possible to store desired addresses. In this manner, a general fuse element stores therein information in a nonvolatile manner by changing its state from a conductive state to an insulating state.

On the other hand, an antifuse element has been attracting attention in recent years. Unlike the general fuse element, the antifuse element stores therein information by changing its state from an insulating state to a conductive state. Writing of data in the antifuse element is performed by an insulation breakdown by an application of a high voltage. Therefore, unlike the general fuse element, the antifuse element does not require an irradiation with a laser beam to write information. As a result, it is possible to perform writing of a defective address at high speed, and at the same time, a dedicated apparatus such as a laser trimmer is not necessary. In addition, because it does not cause any damage to a passivation layer and the like due to an irradiation with a laser beam, it is also possible to enhance the reliability of a product.

The writing of the defective address in the antifuse element is performed after an operation test of devices in the wafer state. The operation test in the wafer state is not performed on a chip-by-chip basis, but is generally performed for a plurality of chips in a parallel manner. By connecting clock terminals, address terminals, and command terminals in common to a plurality of chips to be tested, a clock signal, an address signal, and a command signal are supplied in common to the chips, and in this state, read or write operation is actually performed. As for input/output data, at least, it needs to be input or output independently for each of the chips, data input/output terminals of the chips are not connected in common, which is matter of course.

In this way, at the time of the operation test in the wafer state, because the address terminals are connected in common to a plurality of chips to be tested, it is not possible to supply an independent address to each of the chips. However, a defective address that is supposed to be detected is naturally different for each of the chips. Therefore, the writing of the defective address needs to be performed for each of the chips, and it is impossible to write the defective address in a plurality of chips in parallel. That is, although the operation tests of a plurality of chips can be performed in parallel, the writing of the defective address needs to be performed independently for each of the chips.

The writing of the defective address in the antifuse element can be performed at high speed as compared to the case that the defective address is written in a fuse element by an irradiation with a laser beam. However, because the writing of the defective address in the antifuse element is performed by an application of the high voltage, it takes a considerably long time as compared to normal input and output of data. For example, if there are 1000 fuse sets each of which can store one address, and if the write time for a single fuse set is 5 milliseconds, it takes about 5 seconds per chip to perform writing of data for all the fuse sets.

As a method to cope with such a problem, a method has been proposed in which a dedicated latch circuit for temporarily storing a defective address is provided, and after the defective address being written in the latch circuit, the writing process in the antifuse element is actually performed (see Japanese Patent Application Laid-open No. 2004-303354). Because the writing process in the latch circuit can be performed in a remarkably short time, it is possible to complete a supply of the defective address to each of the chips in a short time. The actual writing processes in the antifuse elements are then performed for a plurality of chips in parallel, which makes it possible to perform the writing process in the antifuse element at high speed.

However, the dedicated latch circuit for temporarily storing the defective address and the like causes an increase of the chip dimension. Furthermore, the latch circuit is only used for writing the defective address and is no longer used thereafter. Therefore, the increase of the chip dimension due to such a circuit is not desirable.

The above problem is not limited to the case that a defective address is written in an antifuse element, but occurs also in other cases in a semiconductor device that includes both a memory cell for storing data in a reversible manner and another memory cell for storing data in a nonvolatile manner in which desired information (such as a program) is written in the another memory cell.

The present inventors have carried out an examination of a semiconductor device that can write desired information in a memory cell for storing data in a nonvolatile manner at high speed while preventing an increase of the chip dimension, based on recognition of the above problems.

SUMMARY

In one embodiment, there is provided a semiconductor device comprising: a plurality of first memory cells that are assigned addresses for a system that communicates memory information between the semiconductor device and an outside of the semiconductor device; a plurality of second memory cells that are not assigned addresses for the system, the second memory cells storing data for controlling an internal operation of the semiconductor device; a plurality of latch circuits each connected to associated one or ones of the first memory cells and temporarily hold data that is read from the associated one or ones of the first memory cells or data to be written in the associated one or ones of the first memory cells; and a control circuit that performs a control for writing data stored in the latch circuit in the second memory cells.

In another embodiment, there is provided a writing method of a defective address in a semiconductor device, the semiconductor device including a memory cell array that is configured with a plurality of memory cells each selected based on an address supplied from outside, a defective address storing circuit storing therein a defective address indicating an address of a defective memory cell included in the memory cell array, and the writing method comprising: a first writing the defective addresses in a plurality of latch circuits that temporarily hold data that is read from the memory cell array or data to be written in the memory cell array; and a second writing the defective addresses written in the latch circuits into the defective address memory circuits.

In another embodiment, there is provided a semiconductor device comprising: a plurality of first memory cells that are assigned system addresses and store information; a plurality of sense amplifiers that are respectively connected to a plurality of bit lines which are respectively connected to the first memory cells; a plurality of second memory cells that store defective address information of the memory cells in a nonvolatile manner; and a switch circuit that is provided between an external terminal of the semiconductor device and the sense amplifiers, and connects the sense amplifiers to the second memory cells according to a test signal.

In another embodiment, there is provided a semiconductor device comprising: a plurality of first memory cells that store therein data in a reversible manner; a plurality of second memory cells that store therein data in a nonvolatile manner; a plurality of latch circuits that temporarily hold data that are read from the first memory cells or data to be written in the first memory cells; an external terminal that is provided for communicating the data in the first memory cells to an outside of the semiconductor device; and a control circuit that performs a control for inputting a plurality of defective addresses indicating addresses of defective first memory cells supplied from the external terminal to the latch circuits and writing saving data indicating the defective addresses that are held in the latch circuits into the second memory cells.

According to the present invention, because information to be stored in a second memory cell such as a defective address memory circuit, for storing data in a nonvolatile manner, is temporarily stored in a latch circuit that is provided for a first memory cell such as a regular memory cell, it does not necessary to provide any dedicated latch circuit for each of the second memory cells. Therefore, a writing process in the second memory cell such as a defective address memory circuit can be performed at high speed without causing an increase of the chip dimension due to a dedicated latch circuit.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

A representative example of the technical scope of the present invention for achieving the object of the invention is described below. Note that the claimed aspects of the present application are not limited to this technical scope, and, needless to mention, these aspects are defined by the description of the claims of the present application.

Focusing on a point that a latch circuit for temporarily storing read data or write data, such as a sense amplifier that is required for communicating with the outside of a semiconductor device, is allocated for a regular memory cell of a DRAM and the like, the present invention is for, using the latch circuit at the time of a test process, temporarily storing in the latch circuit write data to be written in a memory cell for storing data in a nonvolatile manner, which is configured with an antifuse element that stores therein defective address information and the like for saving a regular memory cell. That is, the technical concept of the present invention is to utilize the latch circuit that is naturally provided for a regular memory cell for performing communication of memory information with the outside of the semiconductor device, which is allocated with an address on a system, without arranging a dedicated latch circuit on a silicon bulk, which is only used at the time of writing information in the antifuse element. The information written in the antifuse element is used for controlling the semiconductor device. Therefore, although the antifuse element is a memory element (a second memory cell), which is not associated with an address space provided in the system. On the other hand, the regular memory cell is allocated with the address on the system for performing communication of the memory information with the outside of the semiconductor device (a first memory cell).

Preferred embodiments of the present invention will be explained below in detail with reference to the accompanying drawings.

Figure 1:
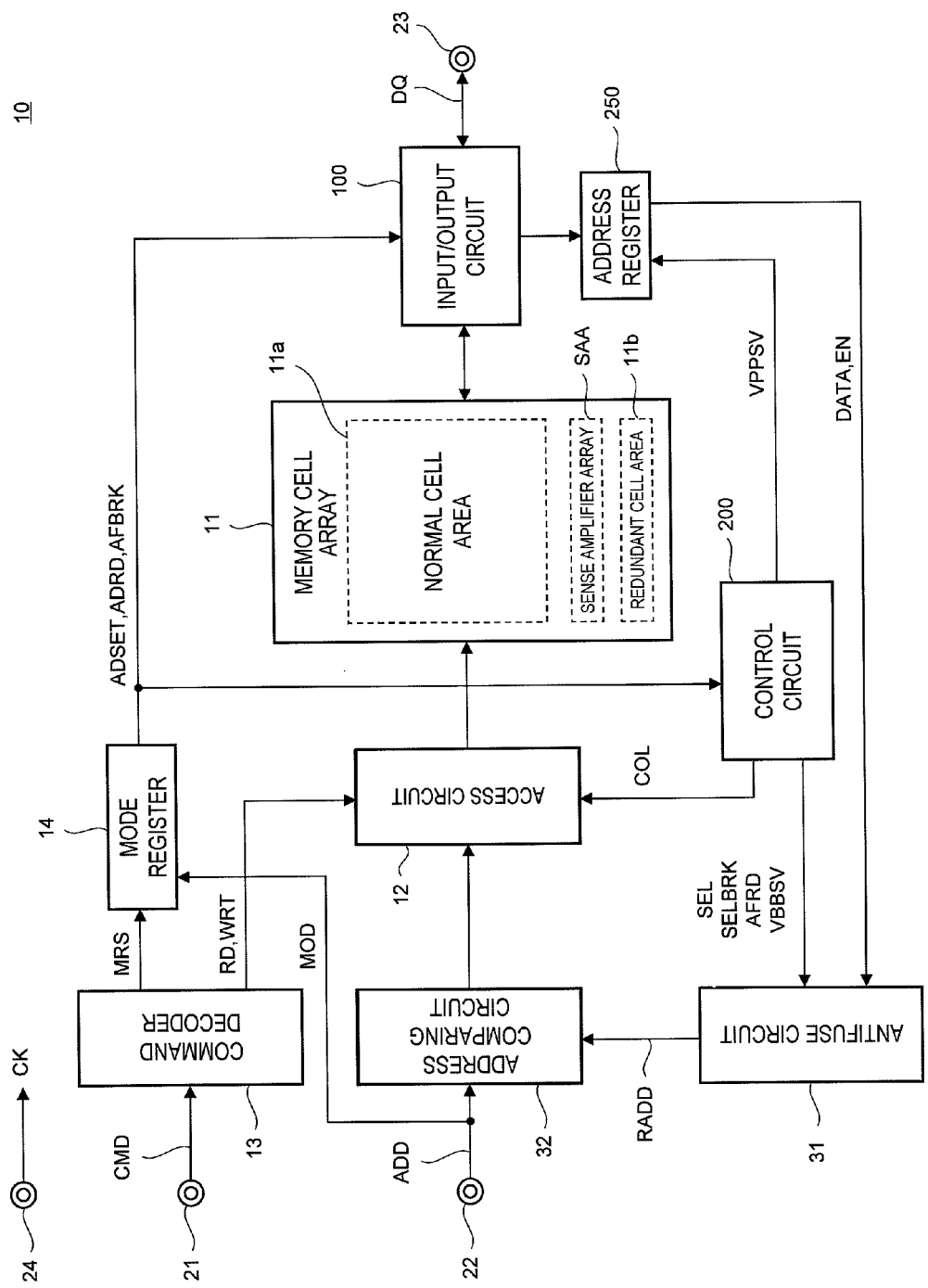
FIG. 1 is a block diagram of a semiconductor device according to a first embodiment of the present invention.

FIG. 1 is a block diagram of a semiconductor device 10 according to a first embodiment of the present invention.

The semiconductor device 10 according to the first embodiment is a semiconductor memory such as a DRAM. The semiconductor device 10 includes a memory cell array 11 that includes a plurality of memory cells, an access circuit 12 that performs an access control for the memory cell array 11, an input/output circuit 100 that performs a data input/output control for the memory cell array 11, and a command decoder 13 that receives the command signal CMD.

Figure 2:
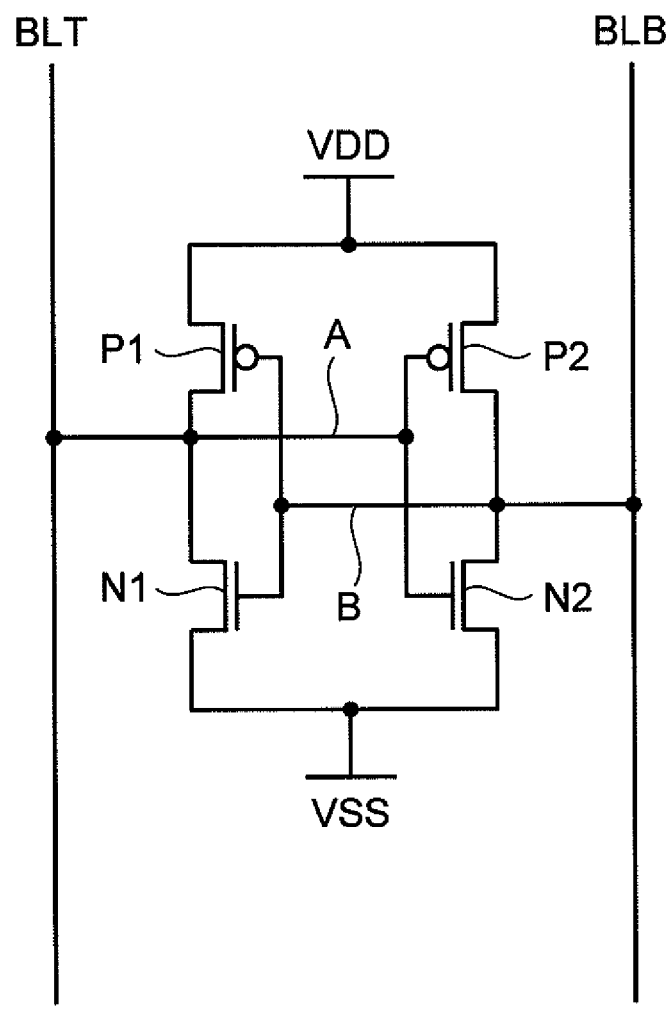
FIG. 2 is a circuit configuration of a sense amplifier.

As shown in FIG. 1, the memory cell array 11 is divided into a normal cell area 11a and a redundant cell area 11b. A memory cell included in the redundant cell area 11b (a redundant cell) is used for saving a defective address by replacing a defective memory cell included in the normal cell area 11a (a defective cell). A memory cell that is selected by the access circuit 12 (a memory cell that is not replaced with a redundant cell or a redundant cell of a replacement destination) is connected to the input/output circuit 100 via a sense amplifier array SAA that is arranged in the memory cell array 11. The sense amplifier array SAA includes a plurality of sense amplifiers. As is widely known to the public, the sense amplifier is a circuit that amplifies a faint signal read from a memory cell. In the case of the DRAM, the sense amplifier has a flip-flop structure as shown in FIG. 2. The sense amplifier array SAA arranged in the memory cell array 11 disclosed in the first embodiment can be substituted by sense amplifiers arranged in the input/output circuit 100 that performs the data input/output control. For example, sense amplifiers can be used, which are arranged on latch circuits (driver circuits having a latch function) close to a data input/output terminal 23 side corresponding to the number of pins of the data input/output terminal 23 or an internal data bus that connects the memory cell array 11 and the input/output circuit 100 (including the number of lines equivalent to the number of pins of the data input/output terminal 23 multiplied by a predetermined integer).

As shown in FIG. 2, a single sense amplifier SA is configured with a P-channel MOS transistor P1 and an N-channel MOS transistor N1 connected to each other in series between power sources VDD and VSS that are controlled by the access circuit 12 and a P-channel MOS transistor P2 and an N-channel MOS transistor N2 connected to each other in series between the power sources VDD and VSS. A connection point A to which the drains of the transistors P1 and N1 are connected in common is connected to a bit line BLT to which one of a plurality of first memory cells is connected. A connection point B to which the drains of the transistors P2 and N2 are connected in common is connected to a bit line BLB to which other one of the first memory cells is connected. The gates of the transistors P1 and N1 are connected to the connection point B in common, and the gates of the transistors P2 and N2 are connected to the connection point A in common.

With this configuration, a potential difference generated between a pair of the bit lines BLT and BLB is amplified by the sense amplifier SA, and amplified data is stored in a static manner. That is, the sense amplifier SA functions as a type of latch circuit. When the amplification is performed on the bit line BLT to which the one of the first memory cells is connected, the bit line BLB represents the reference potential. Likewise, when the amplification is performed on the bit line BLB to which the other one of the first memory cells is connected, the bit line BLT represents the reference potential.

Referring back to FIG. 1, the semiconductor device 10 according to the first embodiment includes a command terminal 21, an address terminal 22, and the data input/output terminal 23 each being configured with a plurality of control terminals, as external terminals. The command terminal 21 is supplied with the command signal CMD, the address terminal 22 is supplied with an address signal ADD, and the data input/output terminal 23 is provided for an output of read data DQ and an input of write data DQ. In addition, the semiconductor device 10 further includes a clock terminal 24 to which a clock signal CK is input and various power source terminals (not shown).

In an operation of the semiconductor device 10 at the time of a normal operation, the command signal CMD is designated by a combination of pieces of information supplied to a plurality of control terminals. For example, when the combination of pieces of information supplied to the control terminals represents a read operation (a read command), a read signal RD is internally generated by the command decoder 13, and the read signal RD is supplied to the access circuit 12. On the other hand, when the combination of pieces of information supplied to the control terminals represents a write operation (a write command), a write signal WRT is internally generated by the command decoder 13, and the write signal WRT is supplied to the access circuit 12.

When the read signal RD is internally generated, a memory cell that is designated by the address signal ADD is selected from among the memory cells included in the memory cell array 11 via an address comparing circuit 32 and the access circuit 12. The read data read from the selected memory cell is output to the data input/output terminal 23 via the input/output circuit 100. The access to the memory cell is controlled by the access circuit 12, and the output operation of the read data DQ is controlled by the input/output circuit 100.

On the other hand, when the write signal WRT is internally generated, the write data DQ that is input to the data input/output terminal 23 is supplied to the memory cell array 11 via the input/output circuit 100, and by a control of the access circuit 12, written in a memory cell that is designated by the address signal ADD.

Furthermore, when the combination of pieces of information supplied to the control terminals represents a mode register set command, a mode register set signal (MRS signal) is internally generated by the command decoder 13, and the MRS signal is supplied to a mode register 14. When the MRS signal is activated, a mode signal MOD that is supplied via the address terminal 22 is supplied to the mode register 14, by which a setting content of the mode register 14 is updated.

An operation mode of the semiconductor device 10 is set in the mode register 14. In the first embodiment, an address set mode, an address read mode, and an antifuse write mode are provided as a test mode that is set in the mode register 14. Upon entering these modes, an address set signal ADSET, an address read signal ADRD, and an antifuse write signal AFBRK are activated, respectively. From the standpoint of the gist of the present invention, the test mode is not necessarily to be set in the mode register 14, but can be set in other means (for example, a setting by a control terminal that is not shown in the drawings). Furthermore, although other types of information (for example, latency information or burst length information necessary for an access to a normal memory cell), explanations of those types of information are omitted because they are not directly relevant to the gist of the present invention.

As shown in FIG. 1, the semiconductor device 10 according to the first embodiment further includes an antifuse circuit 31 and the address comparing circuit 32. For example, the antifuse circuit 31 stores therein an address of a defective cell (a defective address RADD) included in the normal cell area 11a, and as will be described later, it includes a plurality of fuse sets. In the present specification, the address of the defective cell is referred to as a defective address or defective address information. The antifuse further stores therein information other than the defective address information for a memory redundancy, such as information for controlling the internal operation of the semiconductor device and the like. The present invention is also applied to the antifuse that stores therein the information other than the defective address information. An output signal of the antifuse circuit 31 that is corresponding to the information other than the defective address information (bit signals B1 to Bx and an enable signal ENa that are described later) is input to the access circuit 12.

The address comparing circuit 32 compares the defective address RADD stored in the antifuse circuit 31 with the address signal ADD supplied via the address terminal 22. A result of the comparison is supplied to the access circuit 12.

When the result of the comparison indicates that the defective address RADD does not match with the address signal ADD, the access circuit 12 performs an access to the normal cell area 11a. On the contrary, when the result of the comparison indicates that the defective address RADD matches with the address signal ADD, the access circuit 12 performs an access to the redundant cell area 11b. With this operation, the defective address is saved.

Writing of the defective address RADD in the antifuse circuit 31 is controlled by a control circuit 200. Details of the control circuit 200 are described later.

Figure 3:
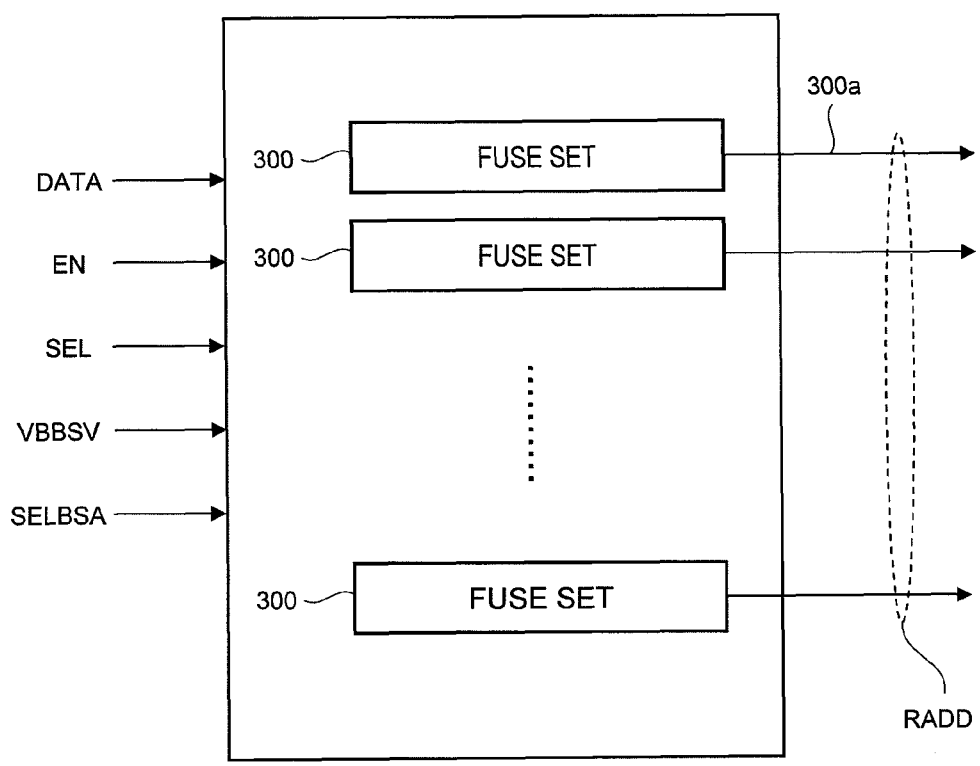
FIG. 3 is a block diagram of the antifuse circuit.

FIG. 3 is a block diagram of the antifuse circuit 31.

As shown in FIG. 3, the antifuse circuit 31 includes a plurality of fuse sets 300 for storing the defective address. Each of the fuse sets 300 is a circuit that can store defect saving information for a memory cell corresponding to one address in a nonvolatile manner or in an irreversible manner. Therefore, the antifuse circuit 31 can store therein as many defective addresses as the number of fuse sets 300. Although the specific number of the fuse sets 300 depends on a product, in many cases, about 1000 sets of the fuse sets 300 are normally provided.

Figure 4:
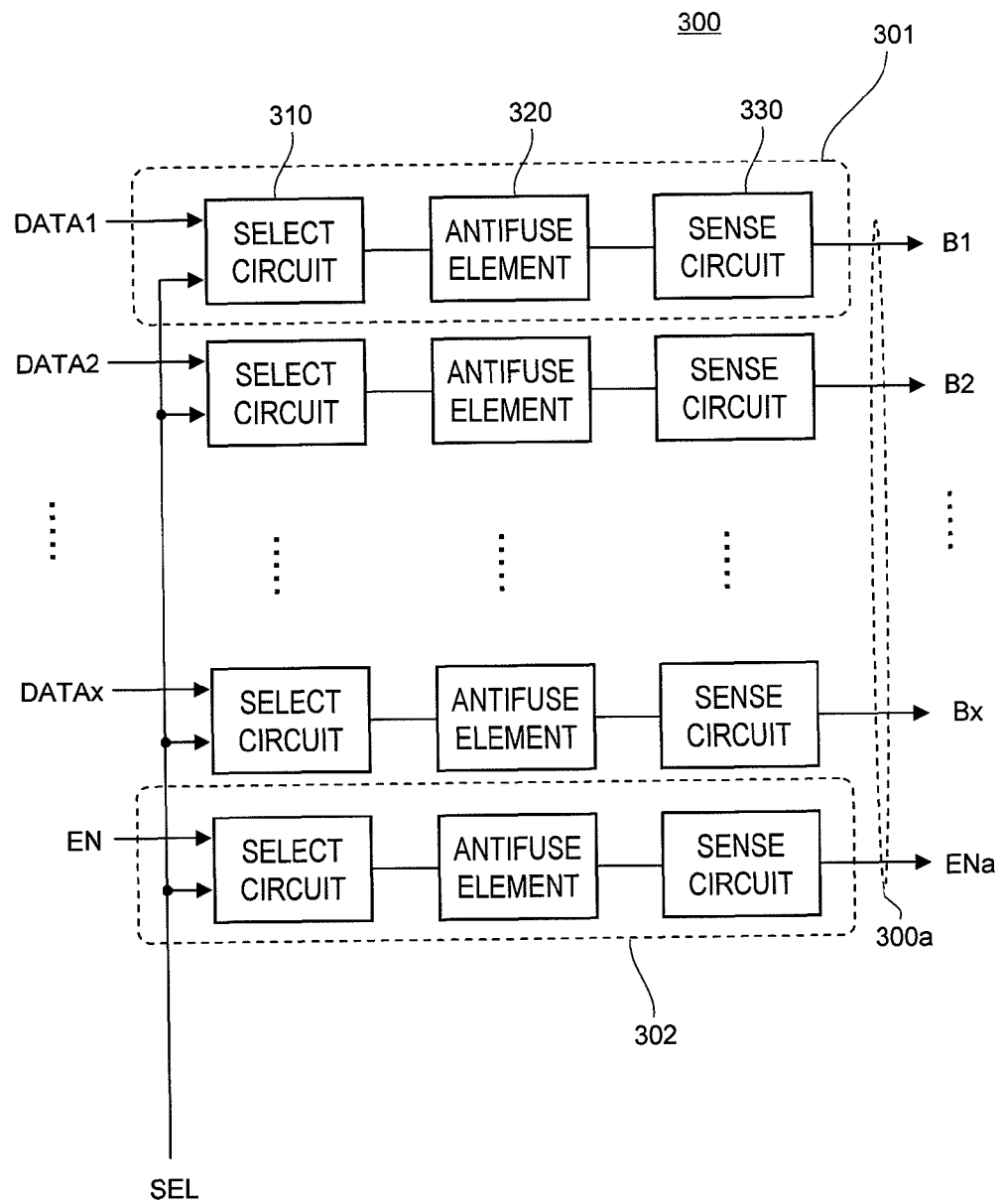
FIG. 4 is a block diagram of the fuse sets.

FIG. 4 is a block diagram of the fuse sets 300.

As shown in FIG. 4, a single fuse set 300 includes x number of bit memory circuits 301 and a single enable circuit 302. Each of the bit memory circuit 301 is corresponding to 1 bit of a defective address to be stored. Therefore, the number of the bit memory circuits 301 (=x) included in the single fuse set 300 is equal to (or larger than) the number of bits of the address to be stored. The enable circuit 302 designates a validity of the fuse set 300.

The bit memory circuits 301 and the enable circuit 302 have the same circuit configuration. Specifically, as shown in FIG. 4, each of the circuits includes a select circuit 310, an antifuse element 320, and a sense circuit 330. The select circuit 310 is activated when the fuse set 300 is selected, to which corresponding one of bit signals DATA1 to DATAx and an enable signal EN is input.

Bit signals B1 to Bx, each of which being an output of its corresponding sense circuit 330, indicates one defective address, and when the enable signal ENa is in an active state, the defective address is valid. On the other hand, when the enable signal ENa is in a non-active state, the defective address is invalid. In this manner, an output 300a of the single fuse set 300 is configured with the bit signals B1 to Bx and the enable signal ENa. As shown in FIG. 3, a set of the outputs 300a is the defective address RADD.

Figure 5:
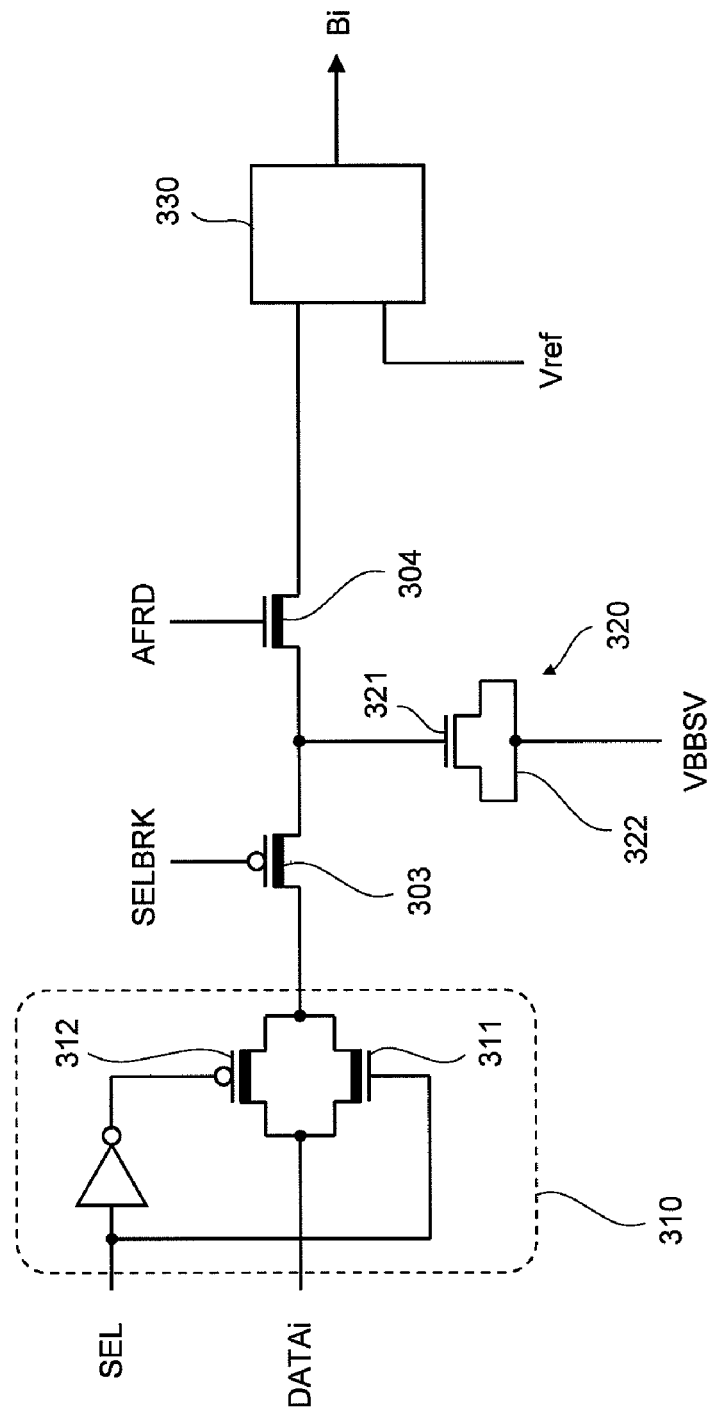
FIG. 5 is a circuit diagram of the bit memory circuit.

FIG. 5 is a circuit diagram of the bit memory circuit 301.

As shown in FIG. 5, the select circuit 310 included in the bit memory circuit 301 has a transfer gate structure in which an N-channel MOS transistor 311 and a P-channel MOS transistor 312 are connected to each other in parallel. A select signal SEL and its inverted signal are supplied to gates of the transistors 311 and 312, respectively. The select signal SEL is provided for selecting a desired one of the fuse sets 300, and therefore, a different one of the select signal SEL is allocated to each of the fuse sets 300. With this configuration, if the select signal SEL is activated to the High level, a corresponding bit signal DATAi (i=1 to x) is supplied to the antifuse element 320 via a write transistor 303. As will be described later, the bit signal DATAi is supplied by an address register 250 shown in FIG. 1.

The antifuse element 320 has a configuration in which the source and the drain of a MOS transistor are short circuited, an output of the select circuit 310 is supplied to a gate 321 via the write transistor 303, and an operation voltage VBBSV is supplied to a source/drain 322. The operation voltage VBBSV is a voltage supplied by the control circuit 200 shown in FIG. 1, which is, for example, −2 volts.

In the antifuse element 320 in an initial state, the gate 321 and the source/drain 322 are isolated from each other by a gate insulating layer. Therefore, there is no current flow between the gate 321 and the source/drain 322. However, if a high voltage is applied between the gate 321 and the source/drain 322, an insulation breakdown occurs in the gate insulating layer, resulting in a current path between the gate 321 and the source/drain 322. After the insulation breakdown of the gate insulating layer, it cannot be restored to its original condition, which makes it possible to perform an irreversible and nonvolatile writing of information. The gate 321 of the antifuse element 320 is connected to the sense circuit 330 via a read transistor 304.

The transistors constituting the select circuit 310 and the transistors 303 and 304 shown in FIG. 5 have a breakdown withstanding configuration in which the gate insulating layer is thick as compared to the other transistors. On the other hand, the transistor constituting the antifuse element 320 is a general transistor such as the one constituting the sense circuit 330 or the other internal circuits, in which the thickness of the gate insulating layer is set to a relatively thin value. This is to protect the select circuit 310 from the insulation breakdown when performing the insulation breakdown of the antifuse element 320. Although the thick gate insulating layer causes a degradation of the performance of the transistor, a slight decrease of the operation speed of the select circuit 310 and the like causes substantially no problem in practice.

The sense circuit 330 is a circuit (a latch circuit) that compares a reference voltage Vref with an output of the antifuse element 320, and holds a result of the comparison. The detailed configuration of the sense circuit is not particularly limited. The sense circuit 330 is activated at the time of hardware resetting or software resetting of the semiconductor device or at the time of power activation of the semiconductor device, and senses the information (defective address information) of the antifuse and holds the information.

The enable signal EN is also supplied to the enable circuit 302, instead of the bit signal DATAi, and an output of the enable circuit 302 is used as the enable signal ENa. Other than that, the enable circuit 302 has the same circuit configuration as the bit memory circuit 301 shown in FIG. 5.

Figure 6:
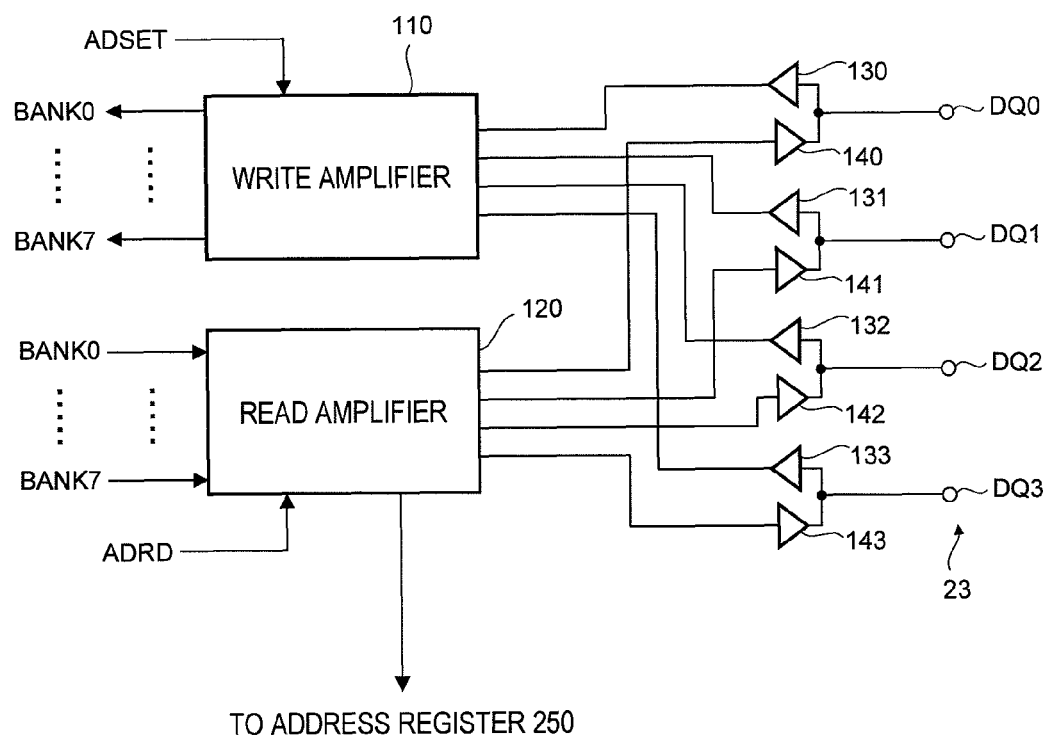
FIG. 6 is a block diagram of the input/output circuit.

FIG. 6 is a block diagram of the input/output circuit 100.

As shown in FIG. 6, the input/output circuit 100 includes a write amplifier 110 and a read amplifier 120. In the first embodiment, the data input/output terminal 23 has four pins (×4 product), which is configured with DQ0 to DQ3. Therefore, at the time of a normal operation, 4-bit data is input and output in parallel. While the number of pins of the data input/output terminal 23 is set to a relatively small value to facilitate the understanding of the present invention, in practice, it is needless to mention that the number of pins of the data input/output terminal 23 is more than four.

The write amplifier 110 takes a role of supplying 4-bit write data to the memory cell array 11 at the time of a write operation. The 4-bit write data is supplied via input buffers 130 to 133. For example, in the first embodiment, the memory cell array 11 has an 8-bank structure (BANK0 to BANK7), and the input 4-bit write data is supplied to anyone of the banks, which is designated by a bank address. The bank indicates a memory area that includes a plurality of memory cell arrays of a predetermined memory size in which the memory cell arrays can perform communication with external terminals (the memory cells can be accessed) with a nonexclusive control. In FIG. 1, the memory cell array 11 is divided into a plurality of banks. The bank includes a bank address. The input/output terminal, which is a part of the external terminals, is common to the banks.

The address set signal ADSET from the mode register 14 is supplied to the write amplifier 110. When the address set signal ADSET is activated, the write amplifier 110 enters a defective address set mode. Furthermore, when the address set signal ADSET is activated, the mode of the write amplifier 110 is changed to handle the semiconductor device 10, which is a ×4 product, as a ×2 product. On the other hand, when the address set signal ADSET is not activated, the write amplifier 110 performs a general write operation as described above.

The read amplifier 120 outputs read data that is read from the memory cell array 11 at the time of a read operation to the outside via output buffers 140 to 143. The read data is output by 4 bits in parallel via the four pins of the data input/output terminal 23 (DQ0 to DQ3). While the number of pins of the data input/output terminal 23 is set to a relatively small value to facilitate the understanding of the present invention, in practice, it is needless to mention that the number of pins of the data input/output terminal 23 is more than four.

The address read signal ADRD from the mode register 14 is supplied to the read amplifier 120. When the address read signal ADRD is activated, the read amplifier 120 enters a defective address read mode. Furthermore, when the address read signal ADRD is activated, the mode of the read amplifier 120 is changed to handle the semiconductor device 10, which is a ×4 product, as a ×2 product. On the other hand, when the address read signal ADRD is not activated, the read amplifier 120 performs a general read operation as described above.

In the present invention, the mode changes of the write amplifier 110 and the read amplifier 120 are not essential. However, because the writing of the defective address is performed for a plurality of chips in parallel in the wafer state, it is preferable to perform the above mode changes in order to reduce the number of pins of the data input/output terminal to be used. For a plurality of chips (DUT (Device Under Test)) to be tested in parallel, the number of DUTs has little influence on the performance of a tester because the address terminal and the command terminal are connected in common. However, because the data input/output terminal needs to be connected independently for each of the chips, the number of DUTs is limited according to the performance of the tester. For this reason, as described in the above example, the semiconductor device 10, which is a ×4 product, is handled as a ×2 product, to ensure a sufficient number of DUTs.

Therefore, when the address set signal ADSET is activated, the write amplifier 110 supplies a signal that is supplied in succession via the two pins DQ0 and DQ1 of the data input/output terminal, to the memory cell array 11. At this moment, the rest of pins DQ2 and DQ3 of the data input/output terminal are not used. Likewise, when the address read signal ADRD is activated, the read amplifier 120 validates only a signal that is to be output via the two pins DQ0 and DQ1 of the data input/output terminal from among signals read from the memory cell array 11, and ignores the other signals that are to be output via the rest of the pins DQ2 and DQ3 of the data input/output terminal.

Furthermore, when the address read signal ADRD is activated, the read amplifier 120 does not output the read data that is read from the memory cell array 11 to the outside, and instead, supplies the read data to the address register 250 shown in FIG. 1. The signal temporarily stored in the address register 250 is supplied to the antifuse circuit 31. The memory capacity of the address register 250 is smaller than the total number of the antifuse elements. By performing a plurality of transfer operations as will be described later, the process is performed for a memory capacity for a plurality of defective addresses to be stored in a plurality of sense amplifiers corresponding to the total number of the antifuse elements. In other words, the following relationship is established: "memory capacity of the address register 250"<"number of the antifuse elements"="number of the sense amplifiers corresponding to the number of the antifuse elements".

Figure 7:
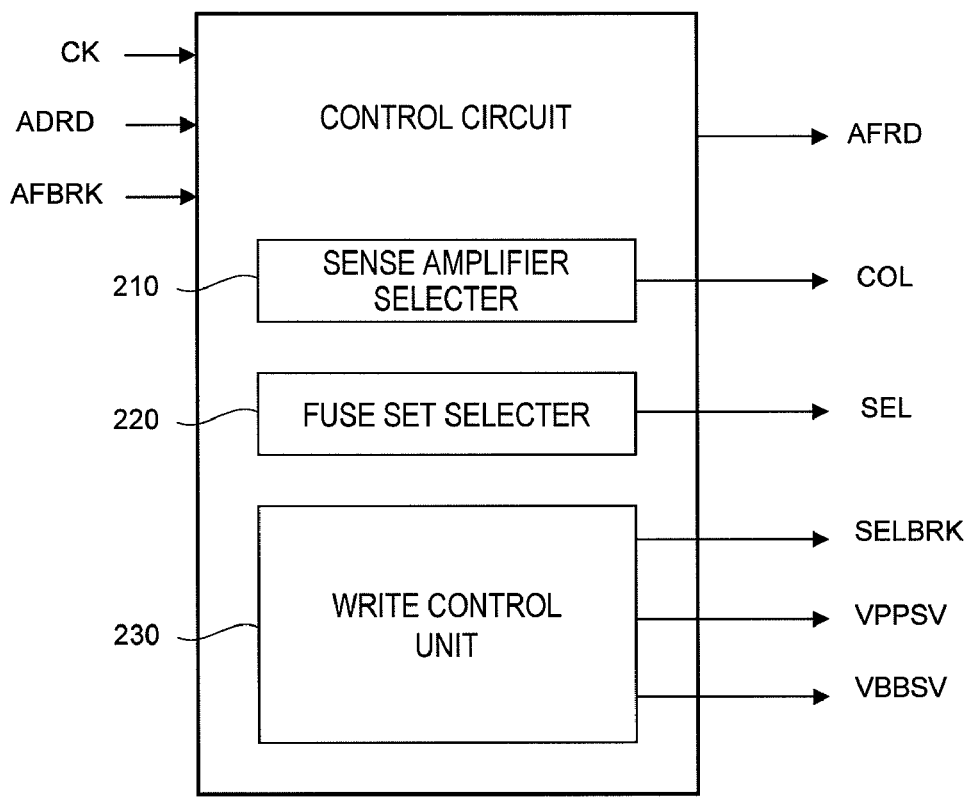
FIG. 7 is a block diagram of the control circuit.

FIG. 7 is a block diagram of the control circuit 200.

As shown in FIG. 7, the control circuit 200 includes a sense amplifier selector 210, a fuse set selector 220, and a write control unit 230, operating in synchronization with the clock signal CK.

The sense amplifier selector 210 automatically generates a column address COL, which is activated in response to the address read signal ADRD. The column address COL is supplied to the access circuit 12 shown in FIG. 1. In the case of supplying a defective address from the outside to store the defective address in the antifuse element, it can be said that the access circuit 12 is a part of the control circuit 200. It can be also said that the mode register 14 is a part of the control circuit 200.

The fuse set selector 220 automatically generates the select signal SEL, which is activated in response to the antifuse write signal AFBRK. The select signal SEL is supplied to the antifuse circuit 31 shown in FIG. 1.

The write control unit 230 is generates a write signal SELBRK and write voltages VPPSV and VBBSV, which is activated in response to the antifuse write signal AFBRK. The write signal SELBRK and the write voltage VBBSV are supplied to the antifuse circuit 31. The write voltage VPPSV is supplied to the address register 250 shown in FIG. 1.

This is the overall configuration of the semiconductor device 10 according to the first embodiment. The operation of the semiconductor device 10 is explained below focusing on a defective address setting operation. The defective address setting operation is roughly divided into a set operation, a transfer operation, and a write operation. In the set operation, the defective address information is temporarily latched in the sense amplifier array SAA. In the transfer operation, the defective address information latched in the sense amplifier array SAA is transferred to the address register 250. In the write operation, the defective address information transferred to the address register 250 is written in the antifuse element. The set operation is performed by entering the address set mode described above, the transfer operation is performed by entering the address read mode, and the write operation is performed by entering the antifuse write mode.

The set operation, the transfer operation, and the write operation are included in a series of test processes performed in the wafer state.

Figure 8:
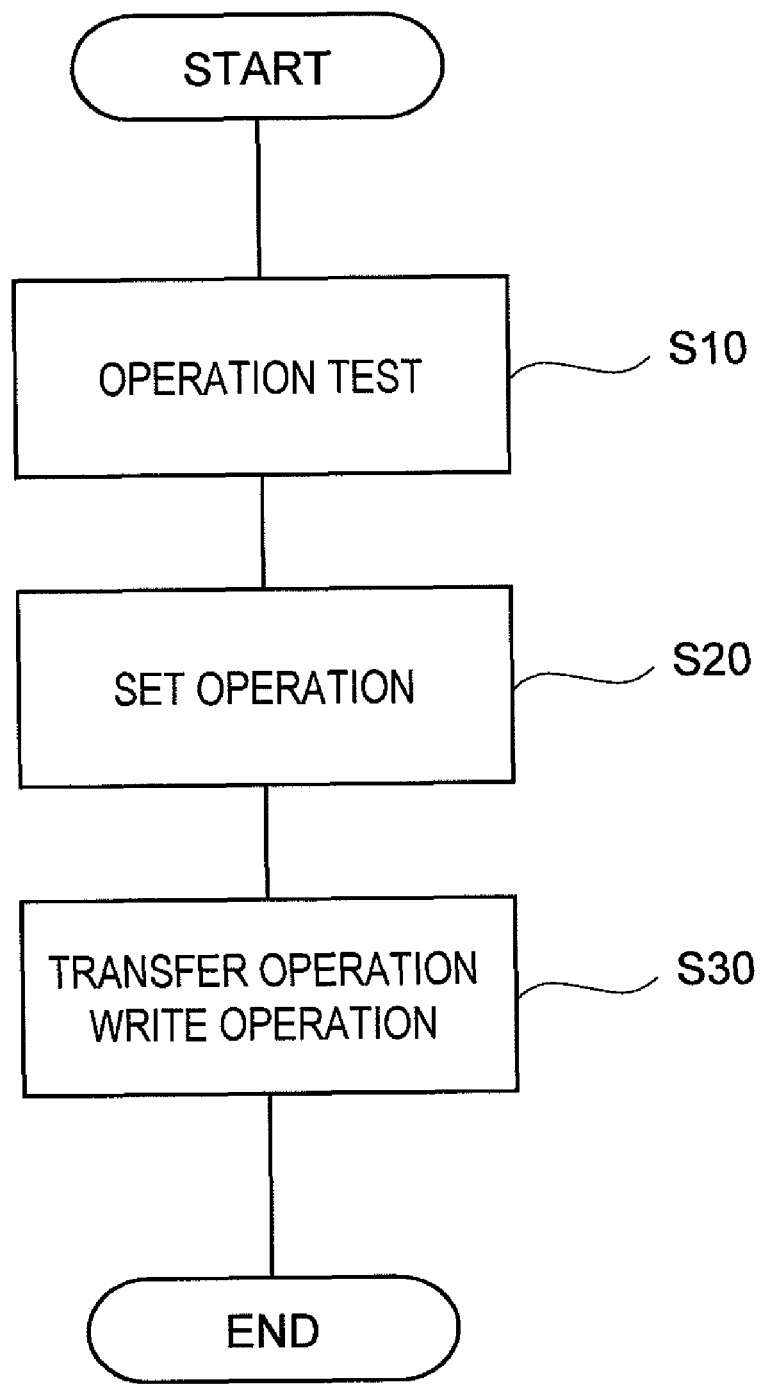
FIG. 8 is flowchart of an outline of the test process.

FIG. 8 is a flowchart of an outline of the test process.

The test process is performed by a tester (now shown). First, as shown in FIG. 8, a detection of a defective address, i.e., an operation test, is performed by actually performing a process of writing and reading data with respect to the normal cell area 11a (Step S10). The defective address that is detected by the above procedure is temporarily stored in an internal memory of the tester.

Thereafter, the tester transfers the defective address stored in the internal memory of the tester to the semiconductor device 10, causing the defective address to be latched in the sense amplifier array SAA in the memory cell array 11 (Step S20). This is the set operation. At this time, the address set mode is set in the mode register 14, by which the address set signal ADSET is activated. Details of the operation at Step S20 are described later.

After that, the tester causes the defective address that is latched in the sense amplifier array SAA to be actually written in the antifuse circuit 31 (Step S30). Although details of the operation are described later, the operation is roughly divided into the transfer operation in which the defective address information stored in the sense amplifier array SAA by the set operation is transferred from the sense amplifier array SAA to the address register 250 and the write operation in which the transferred defective address is written in the antifuse circuit 31. When the transfer operation is performed, the address read mode is set in the mode register 14, by which the address read signal ADRD is activated. On the other hand, when the write operation is performed, the antifuse write mode is set in the mode register 14, by which the antifuse write signal AFBRK is activated. Details of the operation at Step S30 are described later.

Figure 9:
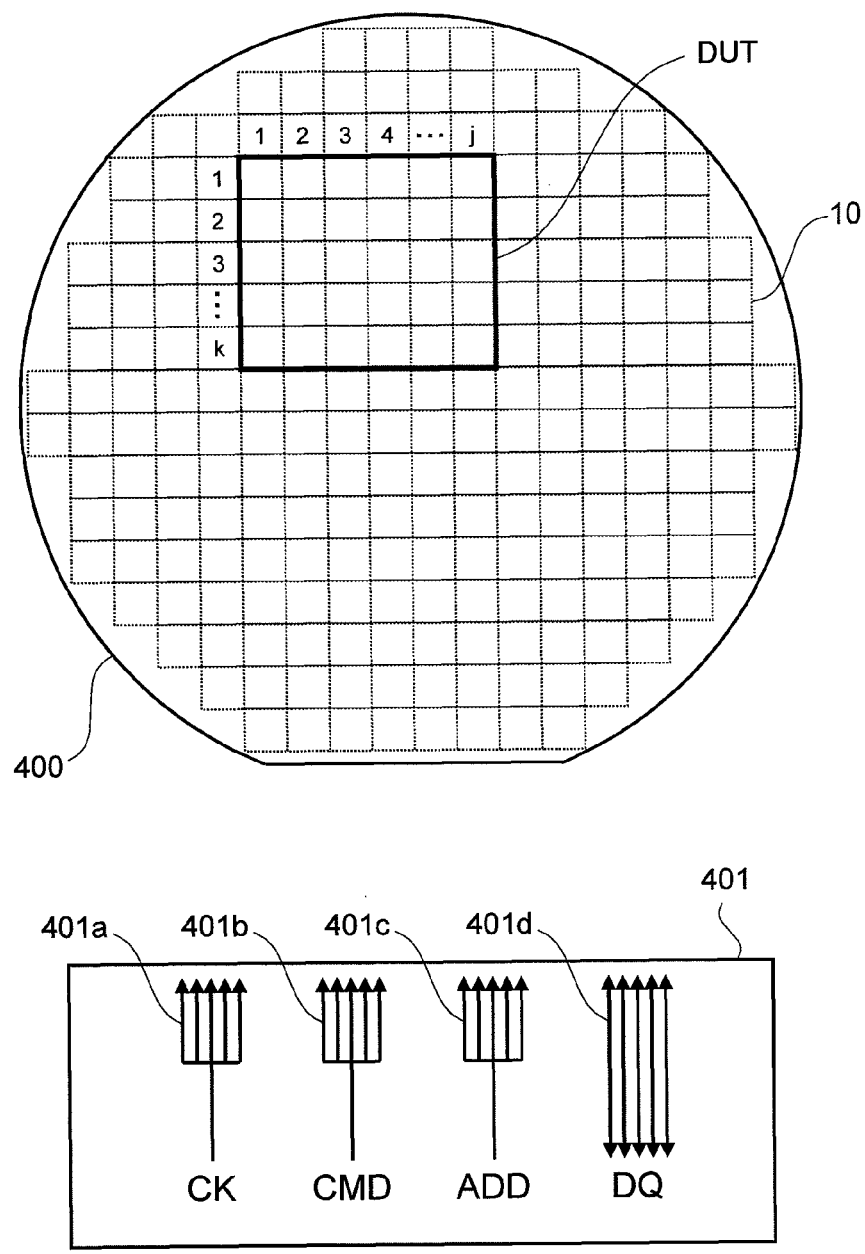
FIG. 9 is a schematic view of a semiconductor wafer and a probe card for testing the wafer.

The above test operation is performed in the wafer state at the time of manufacturing the semiconductor device. The test operation is performed for a plurality of semiconductor devices (chips) in parallel. Specifically, as shown in FIG. 9, the test operation is performed in parallel for j×k numbers of semiconductor devices from among semiconductor devices included in a semiconductor wafer 400. The j×k numbers of semiconductor devices that are tested in parallel are referred to as so-called DUT (Device Under Test). The number of DUTs depends on the configuration of a probe card 401 that is provided in the tester. For example, about 200 semiconductor devices are simultaneously tested in parallel.

The probe card 401 includes a plurality of probes for making contact with the terminals of the semiconductor device to be tested, including a probe 401a for supplying the clock signal CK, a probe 401b for supplying the command signal CMD, a probe 401c for supplying the address signal ADD, and a probe 401d for exchanging input/output data DQ. As shown in FIG. 9, the probe 401a, the probe 401b, and the probe 401c are connected in common between the chips. This is because it is not necessary to supply the clock signal CK, the address signal ADD, and the command signal CMD independently for each of the chips, but it is enough to supply these signals in common to all the chips.

On the other hand, the input/output data DQ needs to be supplied independently for each of the chips, so that the probe 401d is not connected in common, but is connected independently for each of the chips.

Figure 10:
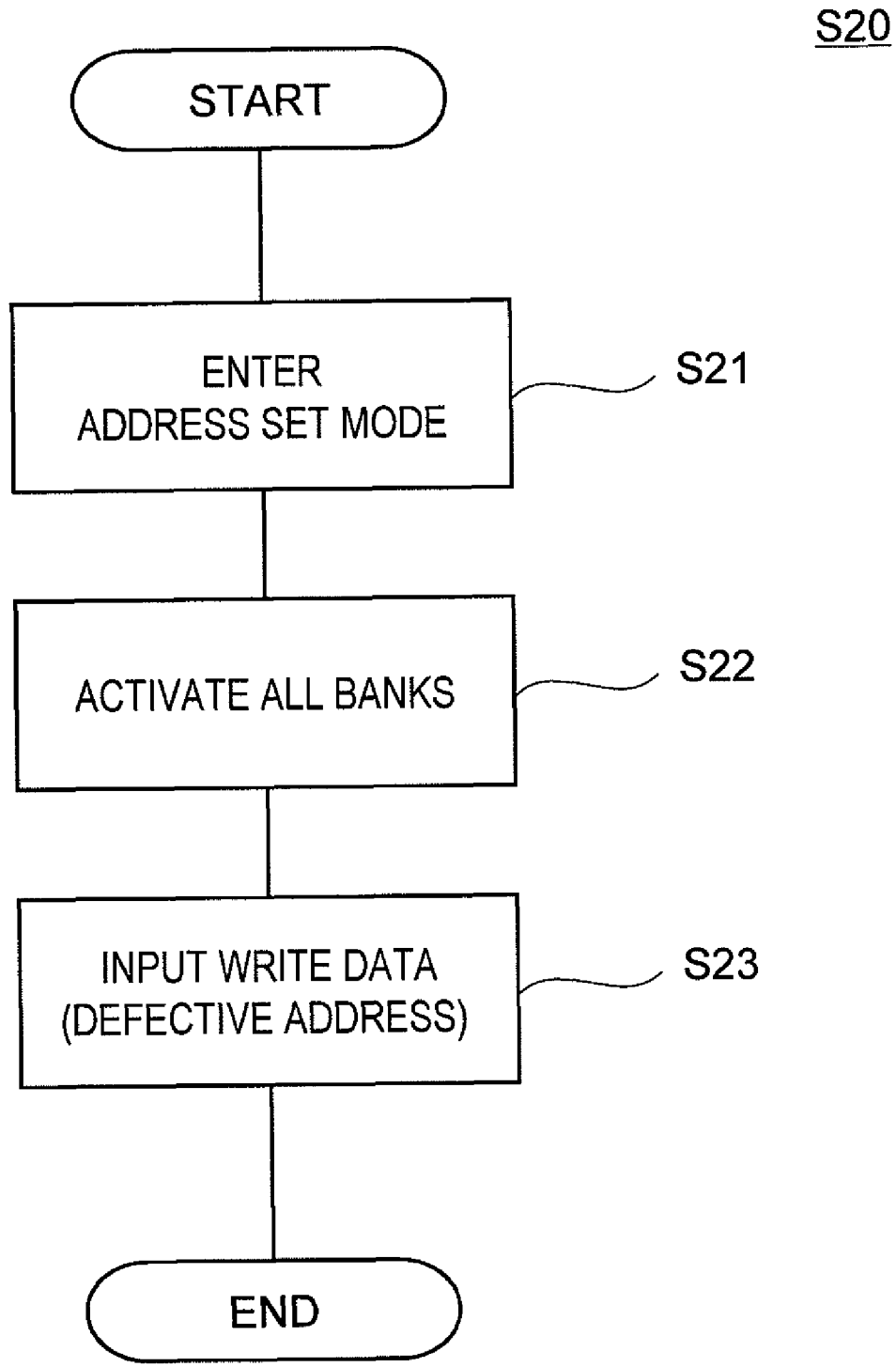
FIG. 10 is a flowchart for explaining the set operation (Step S20)

FIG. 10 is a flowchart for explaining the set operation (Step S20).

The set operation is for transferring the defective address to the semiconductor device 10 and latching the defective address in the sense amplifier array SAA in the memory cell array 11. As described above, the test process is performed in parallel for a plurality of chips, and the address signal ADD is applied to the chips in common. That is, it is not possible to supply the address signal ADD to each of the chips independently. However, in the first embodiment, because the defective address is supplied via the data input/output terminal 23 as the write data DQ, the defective address can be supplied in parallel for the DUTs, which are explained in detail below.

The mode register set command is issued for all of the chips via the command terminal 21, and at the same time, the mode signal MOD indicating the address set mode is input via the address terminal 22. This causes all of the chips to enter the address set mode (Step S21). Upon entering the address set mode, the address set signal ADSET is activated, and the mode is changed such that the input/output circuit 100 handles the semiconductor device 10, which is a ×4 product, as a ×2 product.

Subsequently, an active command (ACT command) is issued via the command terminal 21, and at the same time, a row address and a bank address are input, by which all of the banks are activated (Step S22).

Figure 11:
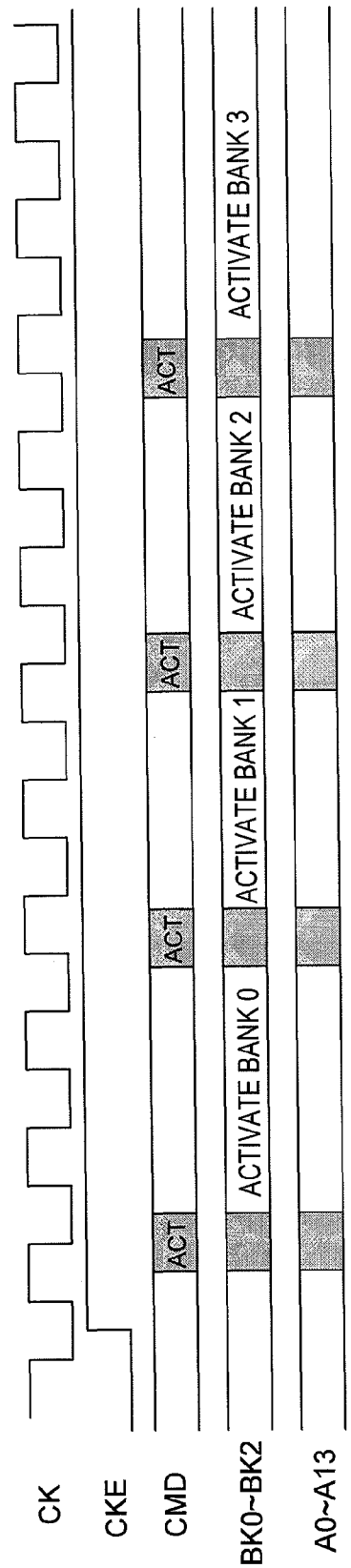
FIG. 11 is a timing chart for explaining the operation at Step.

FIG. 11 is a timing chart for explaining the operation at Step S22.

As shown in FIG. 11, at Step S22, the ACT command and the row address (A0 to A13) and the bank address (BK0 to BK2) are sequentially input in a state that a clock enable signal CKE is at the High level. A fixed value is input for the row address, and different address are input for the bank addresses for each of the ACT commands. By issuing the ACT command for eight times, all of the banks are activated and a predetermined word line is selected in each of the banks.

Figure 12:
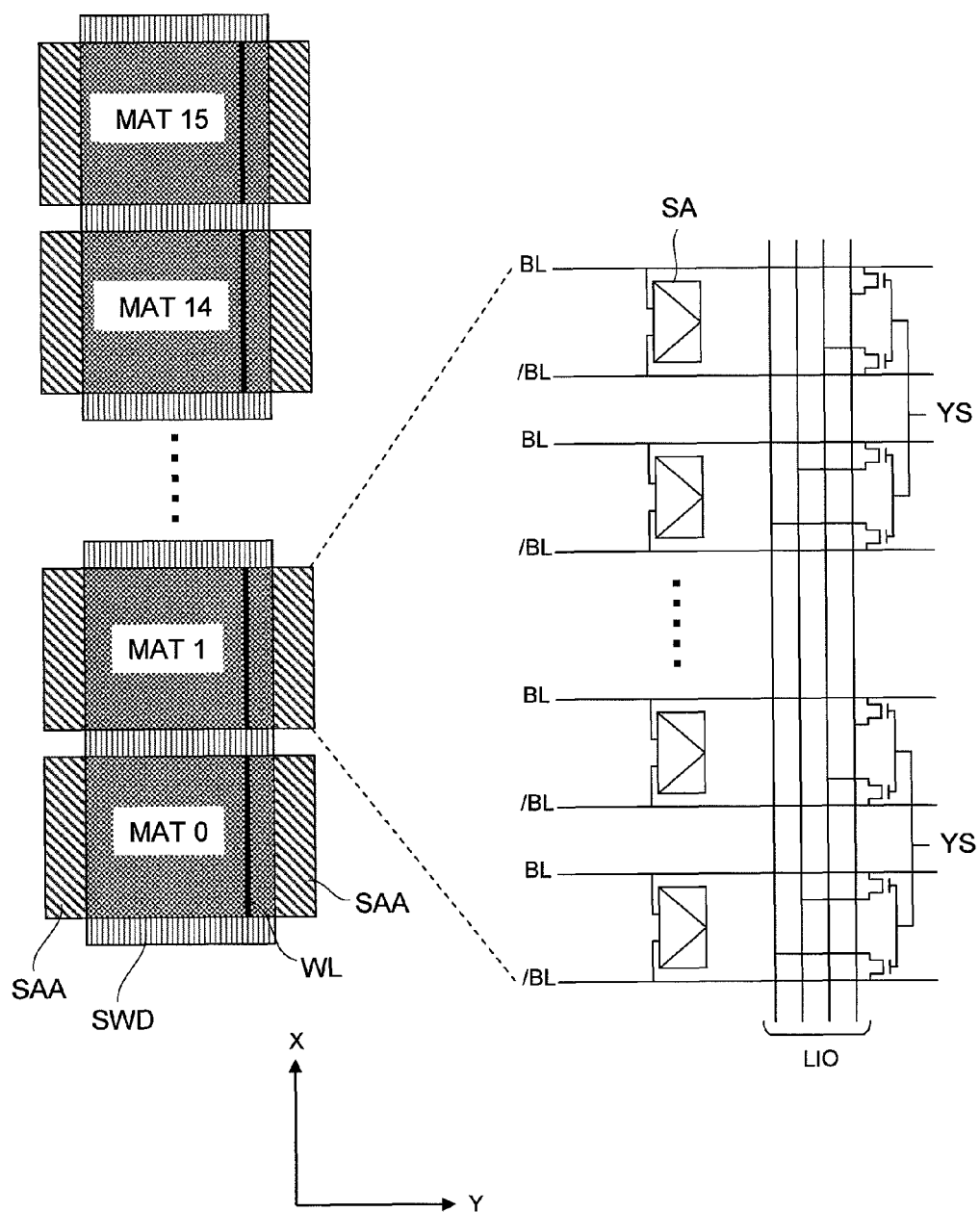
FIG. 12 is an explanatory diagram of a state that a predetermined word line is activated.

FIG. 12 is an explanatory diagram of a state that a predetermined word line is activated.

For example, when each of the banks is divided into m (X direction)×n (Y direction) numbers of mats, if the row address is determined by the ACT command, the m numbers of the mats are selected, and the predetermined word lines WL are simultaneously activated in the m numbers of the mats. For the rest of m×(n−1) numbers of the mats, the word lines are not activated. In the example shown in FIG. 12, m=16, showing a state that the word lines WL are activated for 16 mats.

As shown in FIG. 12, sub-word drivers SWD are arranged on both sides of each of the mats along the X direction, and sense amplifier arrays SAA (corresponding to the sense amplifier array SAA shown in FIG. 1) are arranged on both sides of each of the mats along the Y direction. In the sense amplifier array SAA, the sense amplifier SA is arranged by a plurality of numbers. For example, 512 sense amplifiers SA are allocated to each of the mats, and when 16 mats are selected, it becomes a state that the total of 8192 sense amplifiers SA are activated per bank. Therefore, if eight banks are all activated, 8×8192 sense amplifiers are activated. This is more than enough to cover 10,000 bits to 30,000 bits that is the number of bits required to express all defective addresses.

Referring back to FIG. 10, after activating all of the banks in the above manner, a write command (WRT command) is issued via the command terminal 21, and at the same time, a column address, a bank address and write data are input (Step S23). The column address and the bank address are input via the address terminal 22, and the write data is input via the data input/output terminal 23 (DQ0 and DQ1). The write data referred at this time represents the defective address information of the first memory cell arranged in the normal cell area 11a.

When the column address is input, a predetermined column select signal YS is activated based on the column address, by which a predetermined sense amplifier SA is connected to a local I/O line LIO. In this manner, the sense amplifier SA included in each of the banks is configured with a plurality of sense amplifier group that is selected based on the row address, and any one of the sense amplifiers SA included in the selected sense amplifier group is selected based on the column address.

Figure 13:
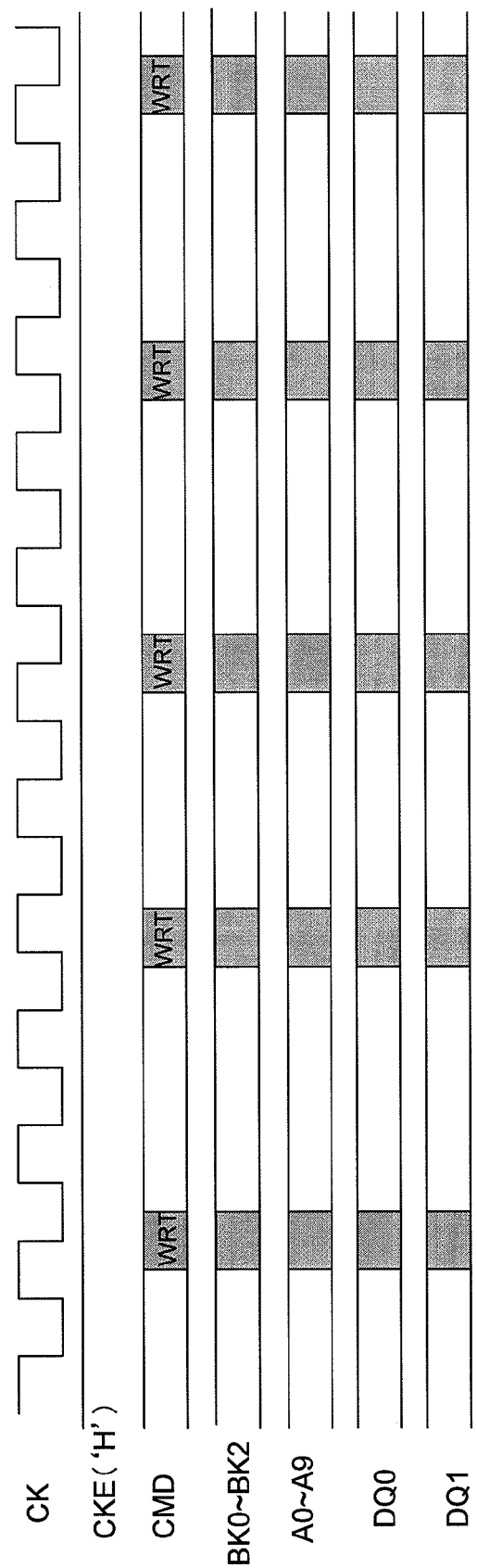
FIG. 13 is a timing chart for explaining the operation at Step S23.

FIG. 13 is a timing chart for explaining the operation at Step S23.

As shown in FIG. 13, at Step S23, the WRT command and the column address (A0 to A9) and the bank address (BK0 to BK2) and write address are sequentially input in a state that the clock enable signal CKE is at the High level. At this moment, values of the column address and the bank address are changed such that a different sense amplifier is selected for each of the WRT commands. Because the two pins DQ0 and DQ1 of the data input/output terminal are used, it is possible to input 2-bit data for a single WRT command. Therefore, the defective address to be set is divided into 2 bits and sequentially input.

Figure 14:
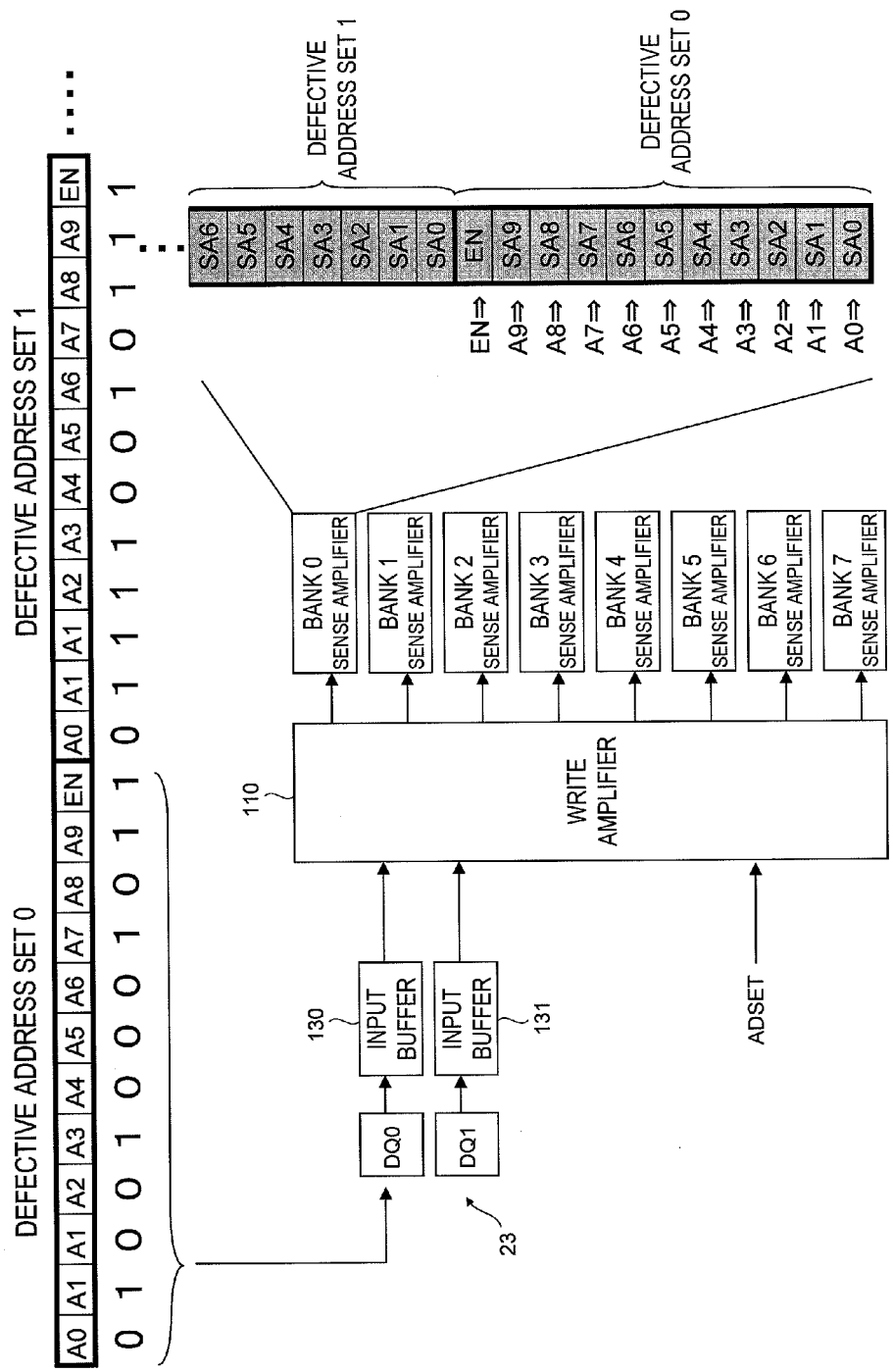
FIG. 14 is an example of the sense amplifier that is a destination for setting the defective address.

FIG. 14 is an example of the sense amplifier that is a destination for setting the defective address.

In the example shown in FIG. 14, a single defective address is configured with a total of 11 bits including 10 bits of the defective address consisting of A0 to A9 and 1 bit of the enable bit EN corresponding to the defective address. This defective address set is input to the data input/output terminal in series from the bit A0, and written in consecutive sense amplifiers SA0 to SA10.

Furthermore, because the predetermined word lines are activated at Step S22, the defective address set written in the sense amplifiers is written in the first memory cell that is connected to the bit line via the bit line. However, in the first embodiment, wiring of the defective address set in the memory cell is not essential. Therefore, at Step S22, it is enough to designate the memory mat, which means that it is not essential to activate the word lines. In other words, as long as a circuit change for the test and the number of elements, signal lines, and the like can be simply configured, the sub-word driver can be fixed in a non-active state. In this case, the control can be taken such that only the memory mat address included in the row address (A0 to A13) is validated by entering the address set mode, and each of the word lines WL is remained in a non-active state.

Writing all of the defective addresses in the sense amplifier array SAA in the above manner, the set operation (Step S20) is completed. As described above, the set operation is basically the same as the write operation in at the time of the normal operation. Upon completing the set operation (Step S20), the transfer operation and the write operation (Step S30) are performed in succession.

Figure 15:
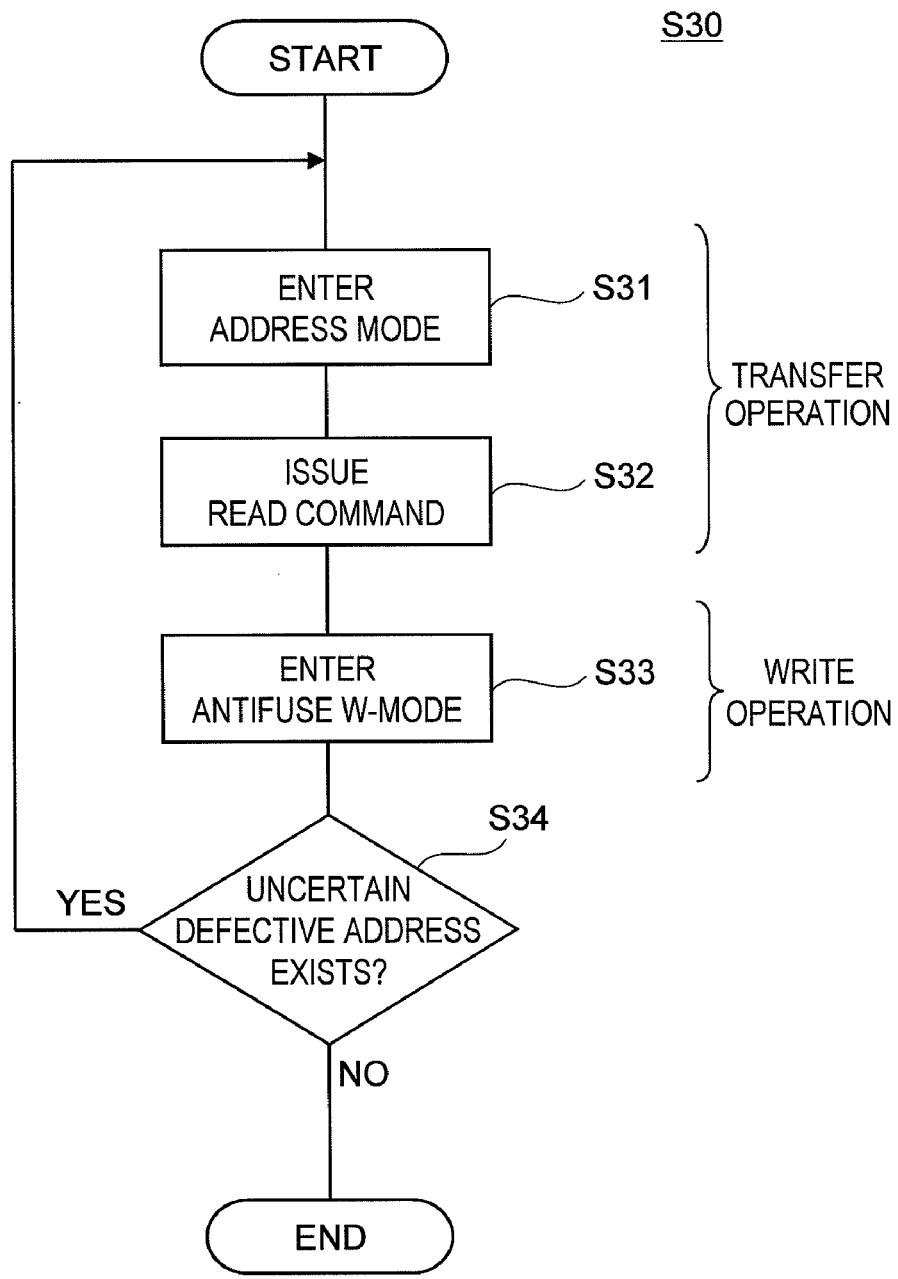
FIG. 15 is a flowchart for explaining the transfer operation and the write operation (Step S30)

FIG. 15 is a flowchart for explaining the transfer operation and the write operation (Step S30). The transfer operation is for transferring the defective address information that is temporarily latched in the sense amplifier array SAA to the address register 250, and the write operation is for actually writing the defective address information that is transferred to the address register 250 in the antifuse circuit 31.

First, the mode register set command is issued for all of the chips via the command terminal 21, and at the same time, a mode signal MOD indicating the address read mode is input via the address terminal 22. This causes all of the chips to enter the address read mode (Step S31). Upon entering the address read mode, the address read signal ADRD is activated, and the sense amplifier selector 210 included in the control circuit 200 becomes ready to automatically generate the column address COL.

In the state of entering the address read mode, a read command (READ command) is issued via the command terminal 21 (Step S32). At this moment, an input of an address is not necessary. When the READ command is issued in the state of entering the address read mode, the sense amplifier selector 210 automatically generates the column address COL, by which the data (defective address information) that is latched in a predetermined sense amplifier SA is read by the read amplifier 120. At this time, because the address read signal ADRD is activated, the read data is not output to the outside, but is transferred to the address register 250. The sense amplifier selector 210 automatically generates different column addresses COL every time the READ command is issued. Therefore, by repeating the operation (Step S32) a plurality of times, it is possible to sequentially transfer a predetermined defective address set to the address register 250. The defective address set transferred to the address register 250 is supplied to the antifuse circuit 31. Therefore, it is enough to set the address register 250 by only the size of the defective address set (11 bits), which is far smaller than the number of the dedicated latch circuits (10,000 bits to 30,000 bits) included in all of the conventional antifuses.

Upon completing the transfer of the defective address information to the address register 250, a mode register set command is issued via the command terminal 21, and at the same time, a mode signal MOD indicating the antifuse write mode is input via the address terminal 22. This causes all of the chips to enter the antifuse write mode (Step S33). Upon entering the antifuse write mode, the antifuse write signal AFBRK is activated, and the fuse set selector 220 automatically generates the select signal SEL, and at the same time, the write control unit 230 generates the write signal SELBRK and the write voltages VPPSV and VBBSV.

This leads to a state that any one of the fuse sets included in the antifuse circuit 31 is selected by the select signal SEL. In the selected one of the fuse sets 300, as shown in FIG. 5, the transfer gate constituting the select circuit 310 becomes the conductive state. The initial value of the select signal SEL is SEL=0, and is incremented every time entering the antifuse write mode.

When the write signal SELBRK and the write voltages VPPSV and VBBSV are generated in the state that the select circuit 310 is in the conductive state, the defective address set in the address register 250 is written in the selected one of the fuse sets 300.

That is, when the bit in the address register 250 indicates the logical value "1", the voltage VPPSV (4 volts) is supplied to the gate 321 of the antifuse element 320 from the address register 250, and at the same time, the voltage VBBSV (−2 volts) is supplied to the source/drain 322 of the antifuse element 320. This causes a voltage of 6 volts (=4+2 volts) to be applied to the gate insulating layer, by which the insulation breakdown occurs in the antifuse element 320, resulting in a transition from the non-conductive state to the conductive state in an irreversible manner.

On the other hand, when the bit in the address register 250 indicates the logical value "0", 0 volt is supplied to the gate 321 of the antifuse element 320 from the address register 250, and then only a voltage of 2 volts (=0+2 volts) is applied to the gate insulating layer. Therefore, the insulating layer is not broken down, so that the antifuse element 320 remains in the non-conductive state.

Therefore, the defective address and the enable bit transferred to the address register 250 is written in a predetermined one of the fuse sets 300 in a nonvolatile manner.

Figure 16:
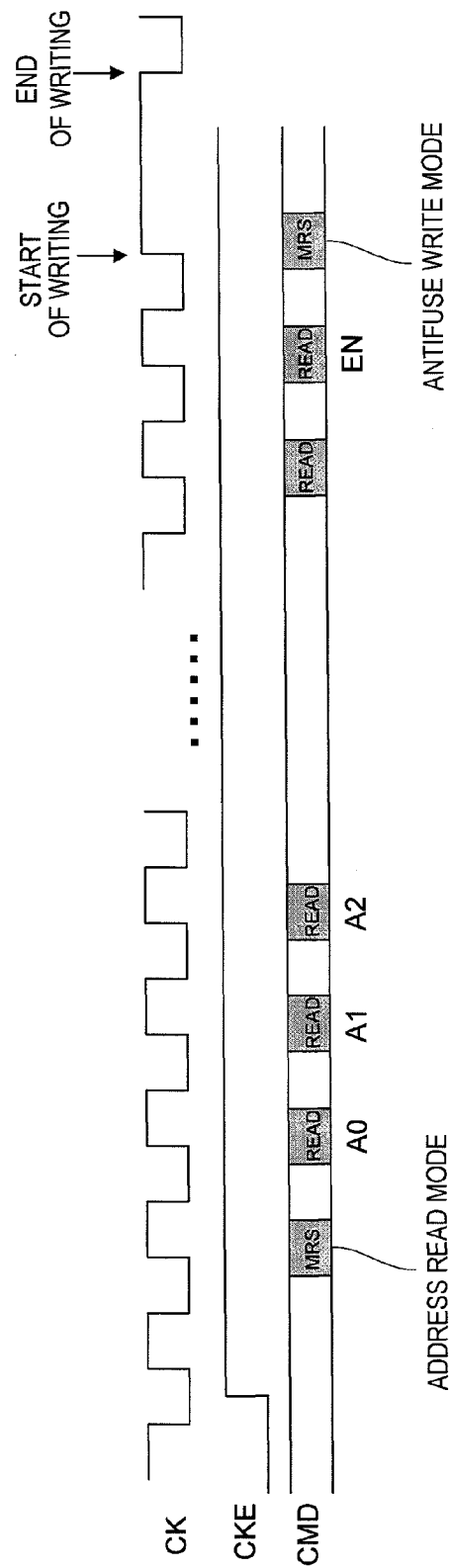
FIG. 16 is a timing chart for explaining the operations at Steps S31 to S33.

FIG. 16 is a timing chart for explaining the operations at Steps S31 to S33.

As shown in FIG. 16, at Steps S31 to S33, the semiconductor device enters the address read mode in a state that the clock enable signal CKE is at the High level, and subsequently, the READ command is input in succession. After a predetermined number of the READ commands are input, the semiconductor device enters the antifuse write mode, by which the writing of information in the antifuse circuit 31 is actually performed. The application of the high voltage to the antifuse circuit 31 is performed for a period in which the clock signal CK is at the High level.

The above process is repeated until all of the defective addresses latched in the sense amplifier array SAA are written in the antifuse circuit 31 (Step S34: NO). That is, the transfer operation from the sense amplifier array SAA to the address register 250 and the write operation from the address register 250 to the antifuse circuit 31 are performed in a repeated manner in units of defective address.

With the above processes, the defective address is written in each of the fuse sets 300.

At the time of actual usage (non-test usage), an antifuse read signal AFRD is activated by the control circuit 200. This causes the read transistor 304 in each of the fuse sets 300 to be switched on, the conductive state of the antifuse element 320 is detected by the sense circuit 330, and the conductive state is maintained. The defective address RADD thus generated is supplied to the address comparing circuit 32.

As described above, in the semiconductor device 10 according to the first embodiment, because the defective address that is to be set in the antifuse circuit 31 is once stored in the sense amplifier array SAA, it is not required to provide any dedicated latch circuit for each of the antifuse elements 320. Therefore, it is possible to prevent an increase of the chip dimension due to the dedicated latch circuit.

A second embodiment of the present invention is explained next.

Figure 17:
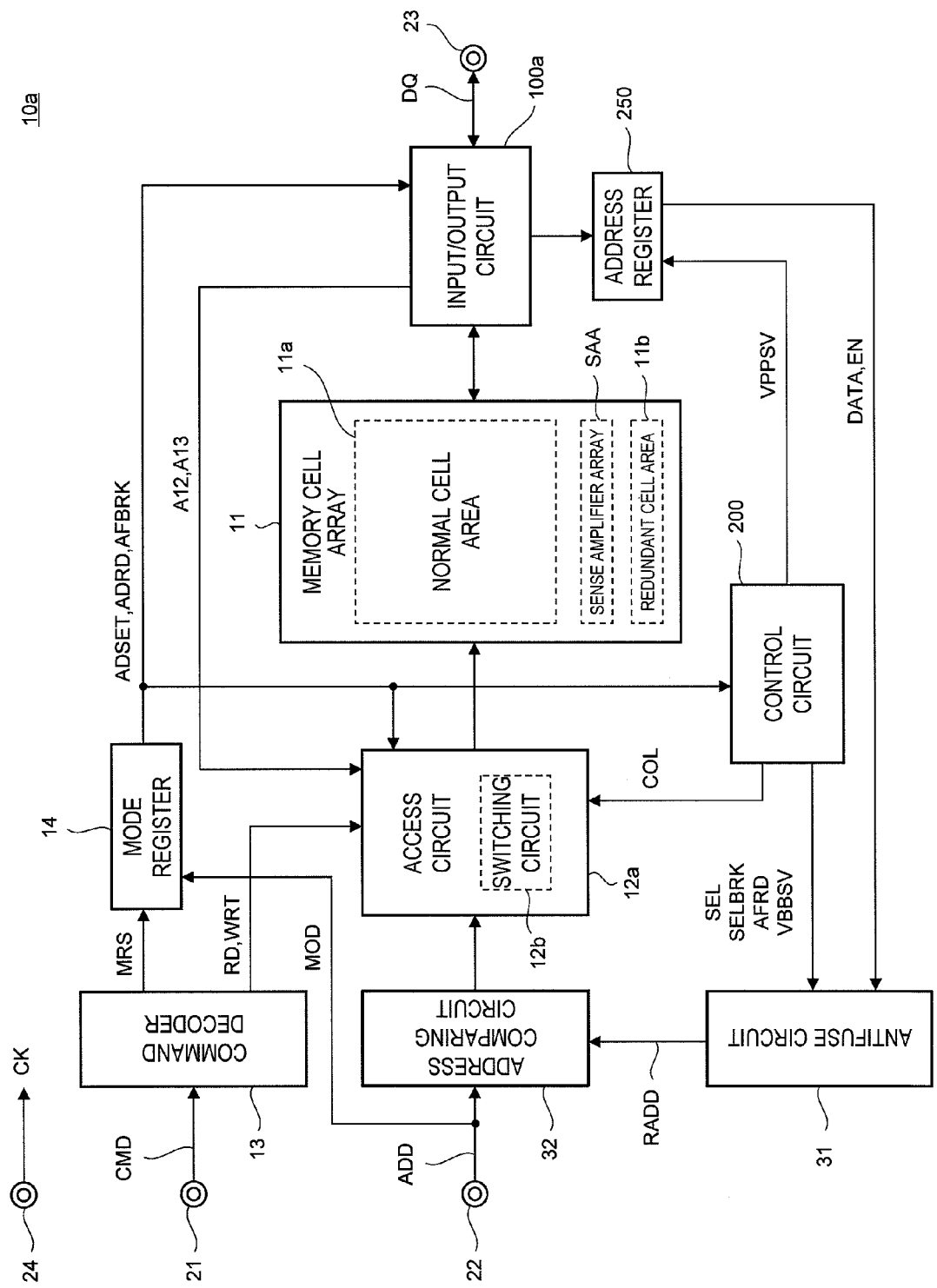
FIG. 17 is a block diagram of a semiconductor device according to the second embodiment.

FIG. 17 is a block diagram of a semiconductor device 10*a* according to the second embodiment.

As shown in FIG. 17, the semiconductor device 10*a* according to the second embodiment is different from the semiconductor device 10 shown in FIG. 1 in that the input/output circuit 100 is replaced with an input/output circuit 100*a* and the access circuit 12 is replaced with an access circuit 12*a*. Because other features of the semiconductor device 10*a* are the same as those of the semiconductor device 10 according to the first embodiment, like constituent elements are denoted by like reference numerals and redundant explanations thereof will be omitted.

When the address set signal ADSET is activated, the input/output circuit 100*a* receives a part of a row address (A12 and A13 in the present example) from the data input/output terminal DQ0 and DQ1, and supplies it to the access circuit 12*a*. When the address set signal ADSET is activated, the access circuit 12*a* receives the part of the row address (A12 and A13) from the input/output circuit 100*a*, not from the address comparing circuit 32, by a control of a switching circuit 12*b*. This makes it possible to separately use four types of row addresses for each chip regardless of using the probe card 401 shown in FIG. 9 in the wafer state. Its significance is as follows.

That is, when latching the defective address in the sense amplifier array SAA, if a sense amplifier SA having a defect (physical defect or electrical defect) is included in the selected sense amplifier array SAA, it is not possible to correctly latch the defective address in the sense amplifier array SAA. The chance of having a defect in the sense amplifier SA is considerable slim, for example, two to three per chip. However, if such a sense amplifier SA having a defect is selected at the time of the defective address set operation, it ends up with a defective chip, decreasing the yield ratio. Therefore, it is required to select a sense amplifier array SAA that does not include any defective sense amplifier SA. However, as described above, because the address signal is common to the chips, it is not possible to input a different address to each of the chips.

To solve the above problem, in the second embodiment, four types of row addresses can be selected for each of the chips by switching the address input such that a part of a row address (A12 and A13) can be input from the data input/output terminal DQ0 and DQ1. As described above, because the chance of having a defect in the sense amplifier SA is considerable slim, the probability of having a defect in all sense amplifier arrays SAA that are designated by the four types of row addresses becomes considerably low. In other words, the probability that at least one of the four types of row addresses is corresponding to a defect-free sense amplifier array SAA is considerably high.

Therefore, if the part of the row address (A12 and A13) is input from the data input/output terminal DQ0 and DQ1 by the switching operation by the switching circuit 12*b*, it is possible to correctly latch the defective address, avoiding a defective sense amplifier. This leads to an enhancement of the yield ratio.

It is apparent that the present invention is not limited to the above embodiments, but may be modified and changed without departing from the scope and spirit of the invention.

For example, in the above embodiments, although the row address and the column address are supplied from the tester in the address set mode, a configuration can be also taken such that the control circuit 200 automatically generates the row address and the column address. Conversely, in the above embodiments, although the column address is internally generated in an automatic manner, a configuration can be also taken such that the tester supplies the column address.

In the above embodiments, although the defective address to be set in the antifuse circuit 31 is temporarily latched in the sense amplifier (that is connected to a bit line to which a regular memory cell is connected), the circuit in which the defective address is temporarily latched is not limited to the sense amplifier. Therefore, as long as the circuit is a latch circuit that temporarily stores therein read data that is read from a main memory cell or write data that is to be written in the main memory cell, any latch circuit other than the sense amplifier (such as a cache memory) can be used.

Furthermore, the main memory cell is not limited to a DRAM, and other types of memory cells (such as an SRAM) can be used. In this case, the sense amplifier explained in the present specification can be merged with the SRAM. Further, it is not essential that the main memory cell is volatile, and the main memory cell can be a nonvolatile memory cell such as a PRAM. That is, as long as the memory cell can perform read and write of data by storing the data in a reversible manner, any types of memory cells can be used.

In the above embodiments, although a case that the defective address is set in an antifuse element has been explained as an example, the element is not limited to the antifuse element. Furthermore, the element is not limited to a type of element that stores therein data in an irreversible manner, such as the antifuse element, but can be a rewritable nonvolatile memory element. Further, it is not essential that the data to be stored in the nonvolatile memory element in a nonvolatile manner is a defective address, which means that the data can be any information for controlling the internal operation of the semiconductor device, such as an output voltage of an internal power generating circuit, an output voltage of a reference voltage generating circuit, program information for an internal timing control circuit or an operation mode setting circuit, or program information for controlling an MCU of the semiconductor device.

In the above embodiments, although the defective address latched in the sense amplifier array SAA is transferred to the address register 250 via the input/output circuit 100, it is not essential that the defective address passes through the input/output circuit 100, which means that a data bus that can transfer the defective address to the address register 250 directly can be used by bypassing the input/output circuit 100. Furthermore, the direct transfer can be realized only with a switch control (that is controlled with a test signal) that realizes a connection between the sense amplifier and the antifuse without using the address register 250.

In the above embodiments, although all banks are activated when latching the defective address in the sense amplifier array SAA, it is not essential to activate all the banks. That is, as long as a necessary number of bits for representing all of the defective addresses can be secured, the configuration can be taken such that a part of the banks or only a single bank is activated. Furthermore, it is not essential either that the memory cell array 11 is divided into a plurality of banks.

In the above embodiments, although the I/O configuration is switched from a ×4 product mode to a ×2 product mode when inputting and transferring the defective address, it is not essential to perform such mode switching in the present invention.

The present invention is not limited to a disclosure in which the address set mode, the address read mode, and the antifuse write mode are set by respective mode resister set commands, and a mode register set command that recognizes these three modes as a single mode can be also used.

The present invention makes no distinction in the relation between the logical value (1 or 0) of blow information for storing data in the sense amplifier and the logical value for whether to actually blow the antifuse.

In the above embodiments, there has been disclosed an example where the present invention is applied to a semiconductor memory device. However, the basic technical concept of the present invention is not limited to semiconductor memory devices, and, needless to mention, it can be applied to general semiconductor devices having a memory function incorporated therein. That is, the present invention can be applied to general semiconductor devices such as a CPU (Central Processing Unit), an MCU (Micro Control Unit), a DSP (Digital Signal Processor), an ASIC (Application Specific Integrated Circuit), and an ASSP (Application Specific Standard Circuit), each including a memory function. Examples of actual semiconductor products to which the present invention is applied include an SOC (System on Chip), an MCP (Multi Chip Package), and a POP (Package on Package). The present invention can be applied to semiconductor devices having such an arbitrary production mode or packaging mode. The present invention makes no distinction in the configuration of a voltage differential amplifier circuit in such semiconductor devices.

Furthermore, it suffices that the transistor used in the present invention is an FET (Field Effect Transistor), and the transistor can be also applied to various types of FETs such as a MIS (Metal-Insulator Semiconductor) transistor and a TFT (Thin Film Transistor) in addition to a MOS (Metal Oxide Semiconductor). Also, the transistor can be a bi-polar transistor.

In addition, the NMOS transistor (N-channel MOS transistor) and the PMOS transistor (P-channel MOS transistor) are representative examples of a first conductivity-type transistor and a second conductivity-type transistor, respectively.

Furthermore, needless to mention, the present invention can be also applied to a logic device or an MCU in which memory cells are incorporated in a mixed manner, and the application of the present invention is not limited to memory systems, but to semiconductor systems in general.

In addition, while not specifically claimed in the claim section, the applicant reserves the right to include in the claim section of the application at any appropriate time the following devices.

A1. A semiconductor device includes,
a plurality of first memory cells that store therein data in a reversible manner;
a plurality of second memory cells that store therein data in a nonvolatile manner;
a plurality of latch circuits that temporarily hold data that are read from the first memory cells or data to be written in the first memory cells;
an external terminal that is provided for communicating the data in the first memory cells to an outside of the semiconductor device; and
a control circuit that performs a control for inputting a plurality of defective addresses indicating addresses of defective first memory cells supplied from the external terminal to the latch circuits and writing saving data indicating the defective addresses that are held in the latch circuits into the second memory cells.

A2. The semiconductor device according to A1, wherein each of the first memory cells may store therein data in a volatile manner.

A3. The semiconductor device according to A2, wherein each of the first memory cells may be a DRAM cell.

A4. The semiconductor device according to A1, wherein the second memory cells may store therein the saving data indicating the defective addresses in an irreversible manner.

A5. The semiconductor device according to A4, wherein each of the second memory cells may be an antifuse element.

A6. The semiconductor device according to A1, wherein each of the latch circuits may be a sense amplifier that amplifies data that is read from the first memory cells.

A7. The semiconductor device according to A1, wherein the control circuit may include a first selector that selects a part of the latch circuits, and a second selector that selects a part of the second memory cells.

A8. The semiconductor device according to A7, may additionally include a register that temporarily holds the saving data read from the latch circuits that are selected by the first selector, wherein
the saving data held in the register may be supplied to the second memory cells that are selected by the second selector, and
a memory capacity of the register may be smaller than a memory capacity of all of the second memory cells included in the semiconductor device.

A9. The semiconductor device according to A8, wherein the control circuit may include a write control unit that generates a write signal for writing the saving data held in the register into the second memory cells that are selected by the second selector.

A10. The semiconductor device according to A1, may additionally include an access circuit that supplies the saving data that are supplied in series via a data input/output terminal that is connected to outside to corresponding ones of the latch circuits.

A11. The semiconductor device according to A10, wherein the latch circuits may be configured with a plurality of latch circuit groups that are selected based on a row address supplied from outside, and
the access circuit may select at least one of the latch circuits included in the selected latch circuit groups based on a column address supplied from outside, the column address being different from the row address.

A12. The semiconductor device according to A11, may additionally include a switching circuit that performs switching operation such that apart of bits of the row address that is represented by a plurality of bits can be input from the data input/output terminal.

A13. The semiconductor device according to A1, wherein the first memory cells may include a plurality of normal cells and a plurality of redundant cells for replacing defective normal cells from among the normal cells, and a plurality of addresses corresponding to the defective normal cells are stored in the second memory cells.

A14. A writing method of a defective address in a semiconductor device that includes a memory cell array that is configured with a plurality of memory cells each being selected based on an address supplied from outside and a defective address memory circuit that stores therein a defective address indicating an address of a defective memory cell included in the memory cell array, the writing method is:
writing a plurality of the defective addresses from outside in a plurality of latch circuits that temporarily hold data that is read from the memory cell array or data to be written in the memory cell array, and
writing the defective addresses written in the latch circuits in corresponding ones of the defective address memory circuits.

A15. The writing method according to A14, wherein
the memory cell array may be divided into a plurality of banks that are capable of performing an nonexclusive control operation to each other, and
in a state that all of the banks are activated, writing the defective addresses in the latch circuits by validating the latch circuits corresponding to the banks.

A16. The writing method according to A14, on writing the defective addresses in the latch circuit, supplying the defective addresses that are supplied in series via a data input/output terminal that is connected to outside to corresponding ones of the latch circuits.

A17. The writing method according to A16, wherein
the latch circuits may be configured with a plurality of latch circuit groups, and
on writing the defective addresses in the latch circuit,
selecting the latch circuit groups by supplying a row address from outside, and
selecting at least one of the latch circuits included in the selected latch circuit groups by supplying a column address from outside, the column address being different from the row address.

A18. The writing method according to A17, wherein on selecting the latch circuit based on the column address, supplying at least a part of the defective addresses simultaneously with the column address.

A19. The writing method according to A17, on selecting the latch circuit groups based on the row address, inputting a part of bits of the row address that is represented by a plurality of bits from the data input/output terminal.

A20. The writing method according to A14, on writing the defective addresses in the defective address memory circuits,
transferring a part of the defective addresses to a register that has a memory capacity smaller than a memory capacity of the defective address memory circuits; and
writing the defective addresses transferred to the register in corresponding ones of the defective address memory circuits, and wherein
the process of transferring and writing are repeated a plurality of times.

What is claimed is:

1. A semiconductor device comprising:
a plurality of first memory cells that are assigned addresses for a system that communicates memory information between the semiconductor device and an outside of the semiconductor device;
a plurality of second memory cells that are not assigned addresses for the system, the second memory cells storing data for controlling an internal operation of the semiconductor device;
a plurality of latch circuits each connected to associated one or ones of the first memory cells and temporarily hold data that is read from the associated one or ones of the first memory cells or data to be written in the associated one or ones of the first memory cells; and
a control circuit that performs a control for writing data stored in the latch circuit in the second memory cells;
wherein the second memory cells store data therein in an irreversible manner.

2. The semiconductor device as claimed in claim 1, wherein each of the second memory cells is an antifuse element.

3. The semiconductor device as claimed in claim 1, wherein each of the latch circuits is a sense amplifier that amplifies data that is read from the associated one or ones of the first memory cells.

4. The semiconductor device as claimed in claim 1, wherein the control circuit includes a first selector that selects a part of the latch circuits, and a second selector that selects a part of the second memory cells.

5. The semiconductor device claimed in claim 4, further comprises a register that temporarily holds data read from the latch circuits that are selected by the first selector, wherein
the data held in the register are supplied to the second memory cells that are selected by the second selector.

6. The semiconductor device as claimed in claim 5, wherein the control circuit includes a write control unit that generates a write signal for writing the data held in the register into the second memory cells that are selected by the second selector.

7. The semiconductor device as claimed in claim 1, further comprising an access circuit that supplies data that are supplied in series via a data input/output terminal to corresponding ones of the latch circuits respectively.

8. The semiconductor device as claimed in claim 7 wherein
the latch circuits are configured with a plurality of latch circuit groups that are selected based on a row address, and
the access circuit selects at least one of the latch circuits included in the selected latch circuit groups based on a column address.

9. The semiconductor device as claimed in claim 8, further comprising a switching circuit that performs switching operation such that a part of the row address can be input from the data input/output terminal.

10. The semiconductor device as claimed in claim 1, wherein
the first memory cells include a plurality of normal cells and a plurality of redundant cells for replacing defective normal cells from among the normal cells, and
the second memory cells store addresses corresponding to the defective normal cells.

11. A writing method of a defective address in a semiconductor device, the semiconductor device including a memory cell array that is configured with a plurality of memory cells each selected based on an address supplied from outside, a defective address storing circuit storing therein a defective address indicating an address of a defective memory cell included in the memory cell array, and
a writing method comprising:
first writing the defective addresses in a plurality of latch circuits that temporarily hold data that is read from the memory cell array or data to be written in the memory cell array; and
second writing the defective addresses written in the latch circuits into the defective address storing circuit;

wherein the latch circuits are configured with a plurality of latch circuit groups, and the first writing includes:

first selecting that latch circuit groups by supplying a row address; and second selecting at least one of the latch circuits included in the selected latch circuit groups by supplying a column address.

12. The writing method as claimed in claim 11, wherein the second selecting is performed by supplying a part of the defective addresses simultaneously with the column address.

13. The writing method as claimed in claim 11, wherein the first selecting is performed by inputting a part of the row address from the data input/output terminal.

14. The writing method as claimed in claim 11, wherein the second writing includes:

transferring the defective addresses written in the latch circuit to a register; and writing the defective addresses transferred to the register into the defective address storing circuits, and wherein the transferring and the writing are repeated a plurality of times.

15. A semiconductor device comprising:

a plurality of first memory cells that are assigned system addresses and store information;

a plurality of sense amplifiers that are respectively connected to a plurality of bit lines which are respectively connected to the first memory cells;

a plurality of antifuses that store defective address information of the memory cells; and a switch circuit that connects the sense amplifiers to the antifuses according to a test signal.

16. The semiconductor device as claim 15, wherein the defective address information are written from the sense amplifiers into the antifuses, when the switch circuit connects the sense amplifiers to the antifuses according to the test signal.

17. A method comprising:

supplying control data to a device that comprises a first memory circuit, a latch circuit configured so as to temporally hold data to be written in the first memory circuit or data read from the first memory circuit, and a second memory circuit;

latching the supplied control data in the latch circuit of the device; and storing, in the second memory, the control data latched in the latch circuit so that the control data is stored in an irreversible manner.

18. The method as claimed in claim 17, wherein the control data is defective address data addressing defective one or ones of cells of the first memory circuit.

19. The method as claimed in claim 17, wherein the control data is supplied via a data input/output terminal, the data input/output terminal being configured so as to input the data to be written in the first memory circuit or output the data read from the first memory circuit.

20. The method as claimed in claim 19, further comprising:

supplying address data to the device, the address data being supplied via the data input/output terminal to address the latch circuit that is to store the control data.

21. The method as claimed in claim 17, wherein the second memory circuit includes a plurality of antifuses.

* * * * *